US008296706B2

(12) United States Patent
Gray et al.

(10) Patent No.: US 8,296,706 B2
(45) Date of Patent: Oct. 23, 2012

(54) HANDLING TWO-DIMENSIONAL CONSTRAINTS IN INTEGRATED CIRCUIT LAYOUT

(75) Inventors: Michael S. Gray, Fairfax, VT (US); Xiaoping Tang, Mohegan Lake, NY (US); Xin Yuan, Roseville, CA (US)

(73) Assignee: International Business Machines Corporation, Armonk, NY (US)

( * ) Notice: Subject to any disclaimer, the term of this patent is extended or adjusted under 35 U.S.C. 154(b) by 229 days.

(21) Appl. No.: 12/767,375

(22) Filed: Apr. 26, 2010

(65) Prior Publication Data
US 2011/0265055 A1 Oct. 27, 2011

(51) Int. Cl.
*G06F 17/50* (2006.01)
(52) U.S. Cl. ........ 716/122; 716/110; 716/113; 716/123; 716/126; 716/132; 716/136; 716/139
(58) Field of Classification Search .................. 716/110, 716/113, 122, 123, 126, 132, 136, 139
See application file for complete search history.

(56) References Cited

U.S. PATENT DOCUMENTS

| 6,063,126 | A  | * | 5/2000 | Borduin .......................... 703/2 |
| 6,086,631 | A  | * | 7/2000 | Chaudhary et al. ........... 716/116 |
| 6,099,583 | A  | * | 8/2000 | Nag ............................... 716/117 |
| 6,189,132 | B1 |   | 2/2001 | Heng et al. |
| 6,543,043 | B1 | * | 4/2003 | Wang et al. ................... 716/122 |
| 6,587,992 | B2 |   | 7/2003 | Marple |
| 6,963,824 | B1 | * | 11/2005 | Davidson et al. ................. 703/2 |
| 6,986,109 | B2 |   | 1/2006 | Allen et al. |
| 7,062,729 | B2 |   | 6/2006 | Gray et al. |
| 7,436,407 | B2 | * | 10/2008 | Doi et al. ...................... 345/441 |
| 7,533,360 | B1 | * | 5/2009 | Ren et al. ...................... 716/126 |
| 7,602,404 | B1 | * | 10/2009 | Reinhardt et al. ............ 345/629 |
| 7,761,819 | B2 | * | 7/2010 | Yang et al. ....................... 716/52 |
| 2007/0266359 | A1 | * | 11/2007 | Esbensen et al. ............... 716/10 |
| 2010/0153892 | A1 | * | 6/2010 | Gray et al. ......................... 716/2 |
| 2011/0270586 | A1 | * | 11/2011 | Diguet et al. ..................... 703/1 |

OTHER PUBLICATIONS

Weis et al.; "A graphtheoretic approach to the relative placement problem"; Publication Year: 1988; Circuits and Systems, IEEE Transactions on; vol. 35 , Issue: 3; pp. 286-293.*
Shin et al.; "Two-Dimensional Compaction by 'Zone Refining'"; Publication Year: 1986; Design Automation, 1986. 23rd Conference on; pp. 115-122.*
Heng et al, "A VSLI Artwork Legalization Technique Based on a New Criterion of Minimum Layout Perturbation", ISPD97 Paper ; 1997.
Shin et al, "An Efficient Two-Dimensional Layout Compaction Algorithm", 26th ACM/IEEE Design Automation Conference 1989.
Wolf et al, "Algorithms for Optimizing, Two-Dimensional Symbolic Layout Compaction", IEEE Transactions on Computer-Aided Design, vol. 7, No. 4, Apr. 1988.

* cited by examiner

*Primary Examiner* — Helen Rossoshek
(74) *Attorney, Agent, or Firm* — Richard M. Kotulak; Hoffman Warnick LLC

(57) ABSTRACT

A computer-implemented method for handling a plurality of constraints in layout optimization for an integrated circuit (IC) layout is disclosed. In one embodiment, the method includes building a graph representing the plurality of constraints; marking two-dimensional constraints in the plurality of constraints; generating two-dimensional clusters including groups of the two-dimensional constraints; handling at least one of the two-dimensional clusters, the handling including finding a solution for the two-dimensional constraints in the at least one two-dimensional cluster; repeating the handling for any unprocessed two-dimensional clusters until all of the two-dimensional clusters are handled; and adopting the solution for each of the two-dimensional clusters to solve at least a portion of the plurality of constraints including the two-dimensional clusters.

20 Claims, 18 Drawing Sheets

HANDLING TWO-DIMENSIONAL CONSTRAINTS IN INTEGRATED CIRCUIT LAYOUT

BACKGROUND OF THE INVENTION

The subject matter disclosed herein relates to handling of two-dimensional constraints in layout optimization for integrated circuit (IC) layouts. Specifically, the subject matter disclosed herein relates to solutions for handling both flat and hierarchical two-dimensional constraints in integrated circuit layouts.

Constraints in integrated circuit layouts may include, e.g., line spacing, line width, minimum area, overlap, enclosure, etc. These constraints are typically imposed at the design phase, prior to producing masks used in the manufacture of the IC. While some constraints can be handled using approaches known in the art (e.g., certain one-dimensional constraints), there exist a portion of the overall constraints that cannot be effectively handled.

BRIEF DESCRIPTION OF THE INVENTION

Solutions for handling of two-dimensional constraints in layout optimization for integrated circuit layouts are disclosed. In one aspect, a computer-implemented method for handling a plurality of constraints in an integrated circuit (IC) layout is disclosed, the method comprising: building a graph representing the plurality of constraints; marking two-dimensional constraints in the plurality of constraints; generating two-dimensional clusters including groups of the two-dimensional constraints; handling at least one of the two-dimensional clusters, the handling including finding a solution for the two-dimensional constraints in the at least one two-dimensional cluster; repeating the handling for any unprocessed two-dimensional clusters until all of the two-dimensional clusters are handled; and adopting the solution for each of the two-dimensional clusters to solve at least a portion of the plurality of constraints including the two-dimensional clusters.

A first aspect of the invention provides a computer-implemented method for handling a plurality of constraints in layout optimization for an integrated circuit (IC) layout, the method comprising: building a graph representing the plurality of constraints; marking two-dimensional constraints in the plurality of constraints; generating two-dimensional clusters including groups of the two-dimensional constraints; handling at least one of the two-dimensional clusters, the handling including finding a solution for the two-dimensional constraints in the at least one two-dimensional cluster; repeating the handling for any unprocessed two-dimensional clusters until all of the two-dimensional clusters are handled; and adopting the solution for each of the two-dimensional clusters to solve at least a portion of the plurality of constraints including the two-dimensional clusters.

A second aspect of the invention provides a computer system comprising: at least one computing device configured to handle a plurality of constraints in layout optimization for an integrated circuit (IC) layout by performing actions comprising: building a graph representing the plurality of constraints; marking two-dimensional constraints in the plurality of constraints; generating two-dimensional clusters including groups of the two-dimensional constraints; handling at least one of the two-dimensional clusters, the handling including finding a solution for the two-dimensional constraints in the at least one two-dimensional cluster; repeating the handling for any unprocessed two-dimensional clusters until all of the two-dimensional clusters are handled; and adopting the solution for each of the two-dimensional clusters to solve at least a portion of the plurality of constraints including the two-dimensional clusters.

A third aspect of the invention provides a computer program comprising program code embodied in at least one computer-readable storage medium, which when executed, enables a computer system to implement a method for handling a plurality of constraints in layout optimization for an integrated circuit (IC) layout, the method comprising: building a graph representing the plurality of constraints; marking two-dimensional constraints in the plurality of constraints; generating two-dimensional clusters including groups of the two-dimensional constraints; handling at least one of the two-dimensional clusters, the handling including finding a solution for the two-dimensional constraints in the at least one two-dimensional cluster; repeating the handling for any unprocessed two-dimensional clusters until all of the two-dimensional clusters are handled; and adopting the solution for each of the two-dimensional clusters to solve at least a portion of the plurality of constraints including the two-dimensional clusters.

BRIEF DESCRIPTION OF THE DRAWINGS

These and other features of this invention will be more readily understood from the following detailed description of the various aspects of the invention taken in conjunction with the accompanying drawings that depict various embodiments of the invention.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated herein, aspects of the invention provide solutions for handling two-dimensional constraints in layout optimization for integrated circuit layouts. Specifically, the subject matter disclosed herein relates to solutions for handling both flat and hierarchical two-dimensional constraints in integrated circuit layouts.

Prior to producing masks needed for the manufacture of integrated circuits (ICs), IC layouts are designed to satisfy design rules specific to the IC manufacture technology. These design rules are usually geometric in nature, and may include, for example, minimum area, width, spacing, overlap and/or enclosure requirements on the IC layout. The rules generally apply to a plurality of regions of an IC layout and apply over a two dimensional space involving one or more layers. By obeying design rules for a given IC technology and circuit requirements of the IC design, such as connectivity, wire widths and device sizes, the IC layout should yield functional and manufacturable chips.

Figure 1:
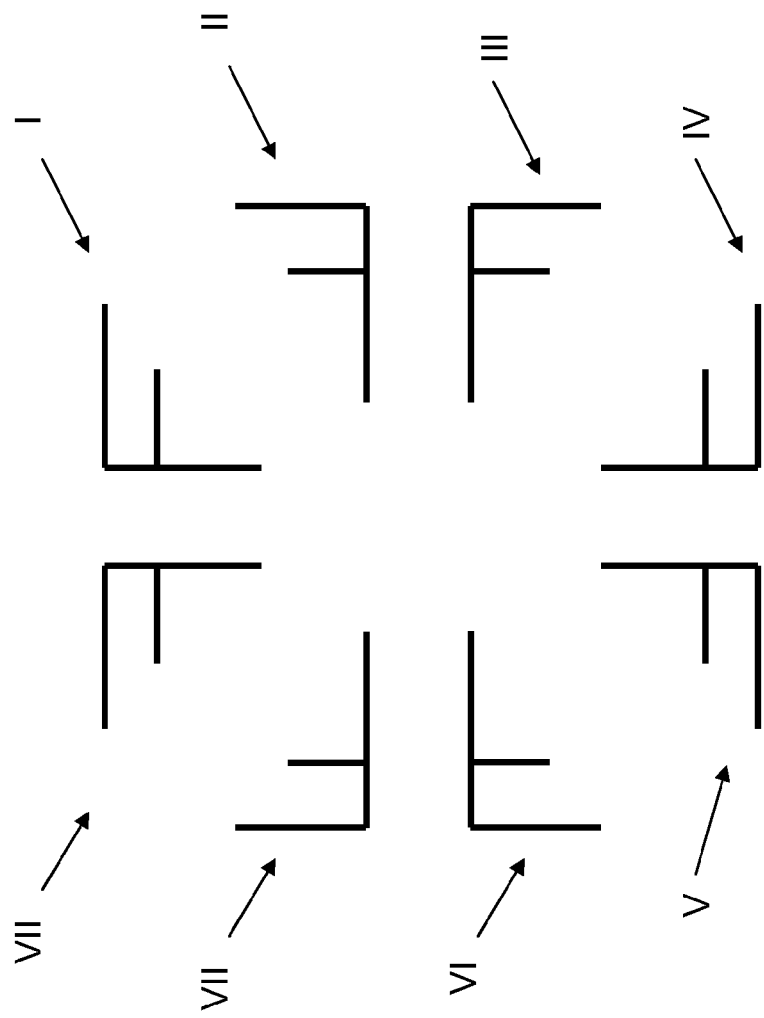
FIG. 1 shows a schematic diagram of possible cell instances and their orientations.

IC layouts are generally partitioned into a hierarchical structure involving cell masters, whereby cell masters are referenced by one or more cell instances, and each cell master in turn may contain layout objects and/or other cell instances. When a cell instance is placed in the layout, it can be placed in one of the eight possible orientations, shown in FIG. 1 The default, or normal cell instance orientation is represented by the letter "F" (numeral "I") and other orientations ("II" through "VII") are represented as rotated or mirrored versions of the normal orientation I. As described herein, two layout objects have the same orientation if the cell instances in which the objects belong have the same orientation. A hierarchical organization of an IC layout helps to efficiently represent repeated structures and to manage large complex ICs or IC components (e.g., lines, interconnects, etc.). For highly regular layouts, array structures may be used to represent rows and/or columns of repeated cell instances.

For many IC layouts, layout designers manually produce the cells composing a layout with the aid of graphical layout editors. Once drawn, the cells may be verified with design rule and circuit verification programs and altered to fix violations. This may be a tedious and costly process and is often repeated for every IC technology that will be used to manufacture chips containing the cells. The process of transforming an existing layout obeying design rules of some IC technology to a new layout obeying design rules of a different IC technology is called layout migration.

Automatic layout migration (also referred to as automatic layout optimization) is a method used at times to optimize a given IC layout subject to a set of design rule constraints. The layout may be optimized by minimizing one or more objectives such as the total layout area, layout perturbation, etc. The layout objects are constrained by design rule interactions and circuit connectivity and parameter requirements, and therefore, are positioned in order to avoid violating any such constraint. Many layout optimization methods are performed in one dimension at a time (one-dimensional optimization) and sometimes on one cell at time. This may simplify the optimization problem to the point that the problem can be solved by efficient solving algorithms. For example, in order to completely minimize the area of a layout in two dimensions, compaction is typically performed in the vertical direction, or Y direction in Cartesian coordinates, and then the horizontal direction, or X direction in Cartesian coordinates. A layout could also be compacted first in the horizontal direction followed by compaction in the vertical direction.

In another approach, layout optimization may also be performed simultaneously in two dimensions. For example, two-dimensional compaction may be used to address diagonal (e.g., corner-to-corner) spacing constraints in an IC layout. While these attempts allow for effective handling of a majority of constraints in a typical integrated circuit layout, there still exist those constraints that cannot be effectively handled using one-dimensional optimization and/or two-dimensional compaction approaches.

Figure 2C:
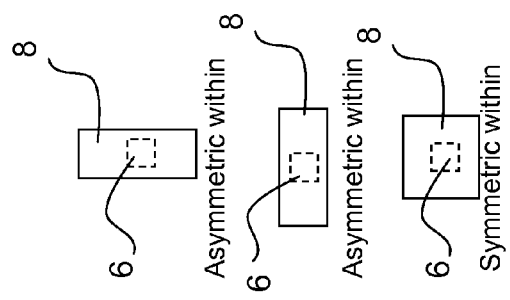
FIGS. 2A-2C show illustrative schematic diagrams of integrated circuit layouts.
Figure 2A:
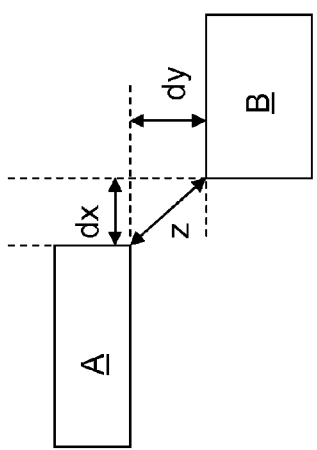

For example, turning to FIG. 2, a few examples of two-dimensional constraints are illustrated. In FIG. 2A, a corner-to-corner spacing example 2 is shown illustrating decomposition of a two-dimensional constraint. Specifically, the diagonal distance from the lower right-hand corner of object A to the upper left-hand corner of object B is represented by the distance Z. This distance Z can be decomposed into two one-dimensional constraints by measuring the y-axis distance (dy) and the x-axis distance (dx) and calculating Z, where Z=SquareRoot($dx^2+dy^2$). In some instances, diagonal corner-to-corner distances may be calculated using a one-dimensional decomposition approach such as that shown in FIG. 2A.

Figure 2B:
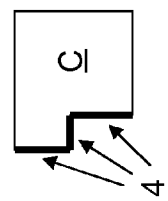

However, FIG. 2B shows a two-dimensional constraint which is not easily decomposed into two one-dimensional constraints. In this case, a "short-edge" constraint may be more difficult to decompose as multiple distances between object edges are taken into account. For example, FIG. 2B shows an object C having short edges 4. A constraint for short edges 4 may include design rules such as: a vertex cannot be connected to two "short" edges (left-side edges shown in bold) having respective lengths less than a threshold distance (e.g., d1). Another constraint may include a design rule such as: any vertex in contact with a "short" edge (left-side edges shown in bold) of less than a threshold distance (e.g., d2) must connect to another edge having a distance of equal to or greater than a threshold distance (e.g., d3). In order to design an object C to meet such constraints, an edge length may be changed, e.g., an edge may be eliminated (e.g., reduced to zero length), or an edge may be expanded to meet the design rules. However, changing the length of one edge may require manipulating the length of a second adjacent edge (the second edge forming a vertex with the first edge). These multi-variable design rules may be difficult to optimize using a one-dimensional decomposition approach.

Turning to FIG. 2C, further examples of two-dimensional constraints that are not easily decomposed into two one-dimensional constraints are shown. In this example, "via coverage" rules are shown. Here, top views of a via 6 that is covered by portions of metal layers 8 (with different design rules) are shown. In these cases, a "via coverage" design rule may include one or more rules such as: spacing between an edge of metal 8 and an edge of via 6 must be greater than or equal to a threshold distance (e.g., d1); spacing between horizontal edges of metal 8 and horizontal edges of via 6 must be greater than or equal to a threshold distance (e.g., d2) and spacing between vertical edges of metal 8 and vertical edges of via 6 must be greater than or equal to a second threshold distance (e.g., d3). In order to place a via 6 within a metal 8 in accordance with such design rules, dimensions of the via 6 and/or metal 8 may be modified. However, as described with reference to FIG. 2B, these multi-variable design rules may be difficult to optimize using a one-dimensional decomposition approach.

It is understood that the teachings of this disclosure may be applied to two-dimensional constraints that are not easily solved using prior approaches (e.g., those more complex than corner-to-corner constraints). While illustrative examples of "short edge" and "via coverage" constraints are used herein, it is understood that the teachings of this disclosure may be applied to a plurality of two-dimensional constraints not explicitly described, e.g., a spacing constraint between two edges dependent upon their common-run length.

Figure 3:
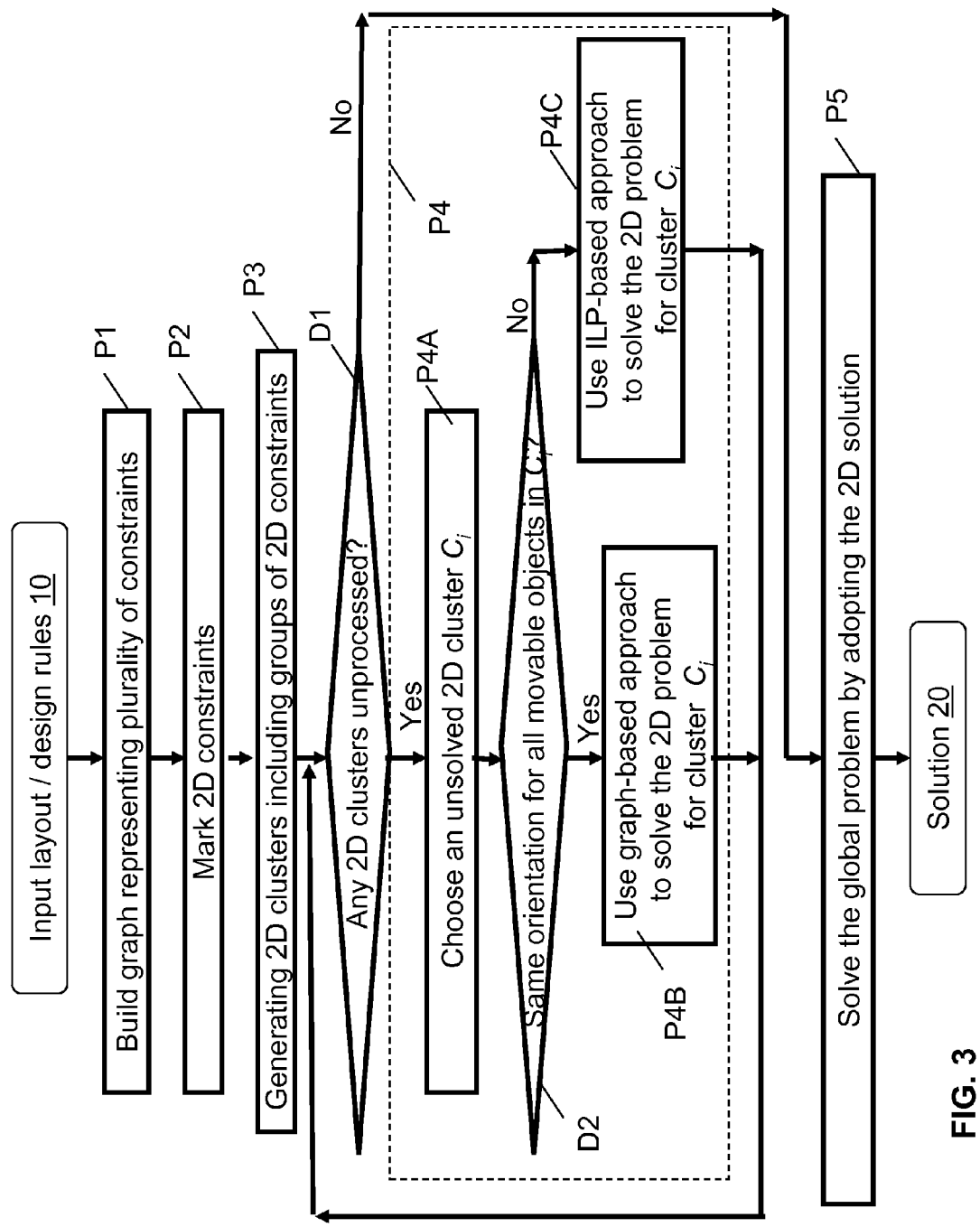
FIG. 3 shows a process flow diagram illustrating a method according to an embodiment.
Figure 4:
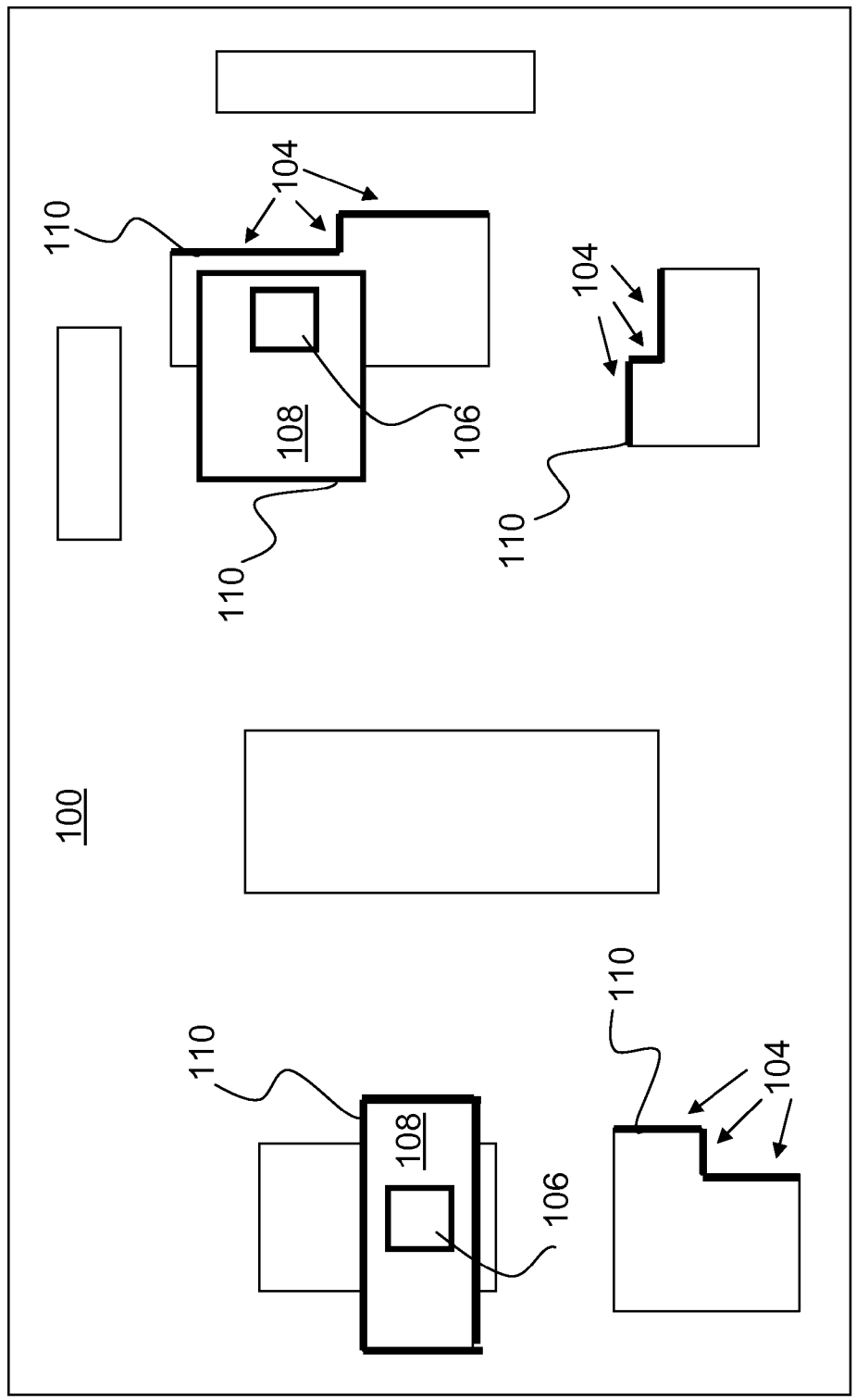
FIGS. 4-10 show illustrative schematic diagrams of portions of an integrated circuit layout.
Figure 5:
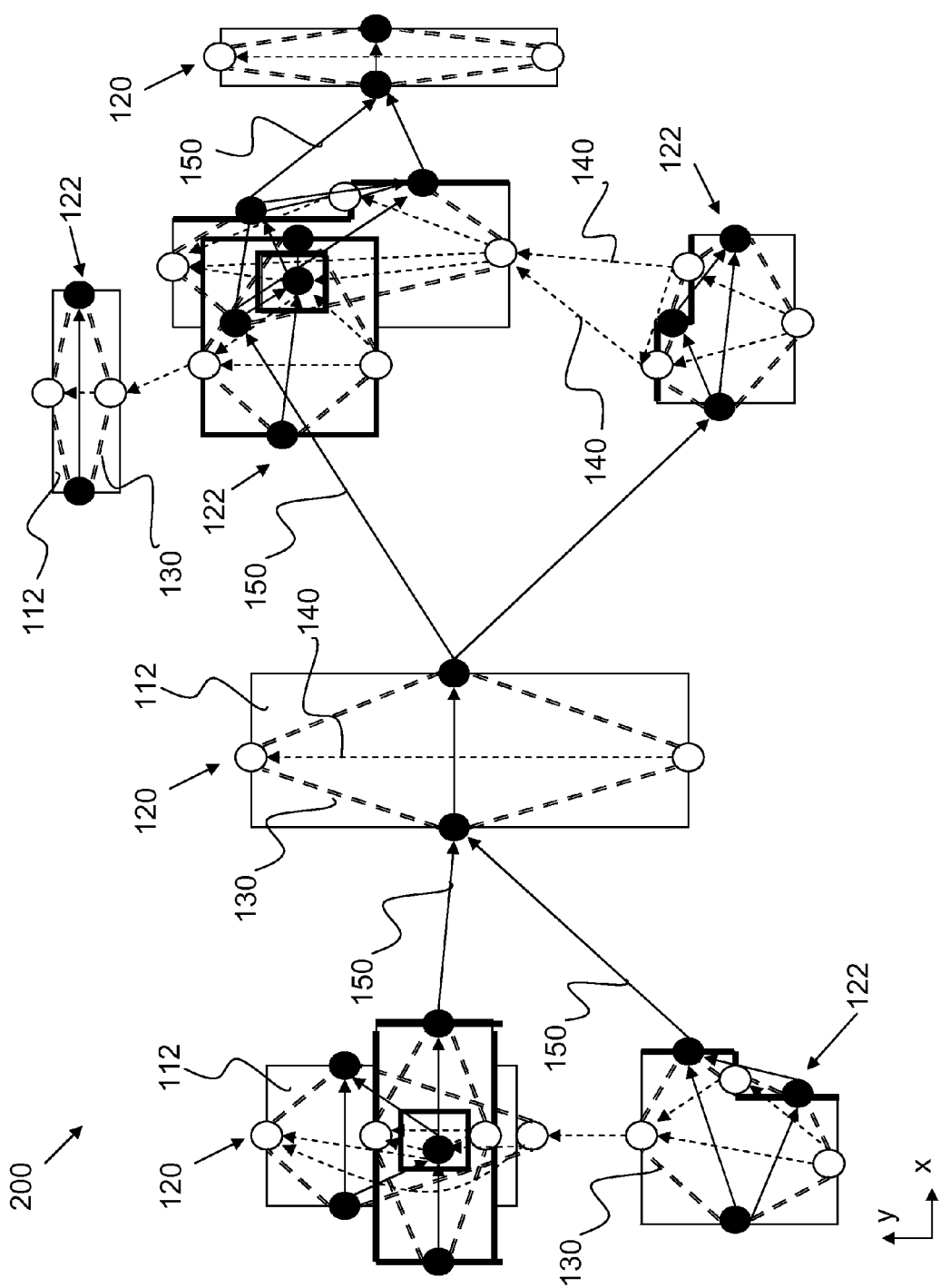

Turning to FIG. 3, a method flow diagram illustrating process in a method according to an aspect of the invention is shown. In one embodiment, the method may include in process P1, building a graph representing a plurality of constraints in an integrated circuit (IC) described by an input layout and design rules (input layout/design rules) 10. Input layout/design rules 10 may be provided, for example, as data indicating one or more geometric relationships between elements within the IC. Input layout/design rules 10 may take any form of data capable of carrying, transmitting, storing, etc., a plurality of constraints in an IC. In any case, process P1 may include building a graph representing a plurality of constraints in an IC. An example preliminary layout 100 is shown in FIG. 4, showing objects having edges 110 involved in two-dimensional constraints (or simply called 2-D constraint edges 110). Layout 100 shown in FIG. 4 is a simple IC layout, illustrating several configurations of the 2-D constraints described with reference to FIGS. 2B and 2C. For example, short edges 104 are illustrated along with vias 106 and metal layers 108 (similar to those short edges 4, vias 6, and metal layers 8 of FIGS. 2B and 2C). 2-D constraint edges 110 are shown in bold, and the complete constraint graph (shown in FIG. 6) illustrates nodes associated with the 2-D constraint edges 110 as well as 2-D constraint arcs. For illustrative purposes, FIG. 5 overlays the constraint graph with the layout in FIG. 4, in order to show how the nodes in the graph correspond to the layout edges, and how the arcs in the constraint graph correspond to the constraints between the layout edges. In the example graph 200 in FIG. 5, all constraints (e.g., 1-D and 2-D) of the layout 100 are marked. In FIG. 5, the plurality of nodes are shown at approximate center points of respective edges of objects 112. Nodes on horizontal edges (or simply, horizontal nodes) 120 are denoted by open circles and nodes on vertical edges (or simply, vertical nodes) 122 are denoted by closed circles. Node connecting arcs 130 (shown as double-dashed diagonal lines) are shown connecting nodes 120, 122 within objects, which indicates that the two corresponding layout edges form a corner within the same object. Y-constraint arcs 140 (those representing y-axis constraints in the Cartesian coordinate system) are shown connecting horizontal nodes 120 (y-constraint arcs 140 denoted by dashed lines with arrow heads). X-constraint arcs 150 (those representing x-axis constraints in the Cartesian coordinate system) are shown connecting vertical nodes 122 (x-constraint arcs 150 denoted by solid lines with arrow heads). In this example constraint graph 200, the graph is a function of nodes (120, 122) and arcs (130, 140, 150) between those nodes. An arc (130, 140, 150) between two nodes represents a constraint (e.g., a spacing requirement) between two edges of an object 112.

Figure 6:
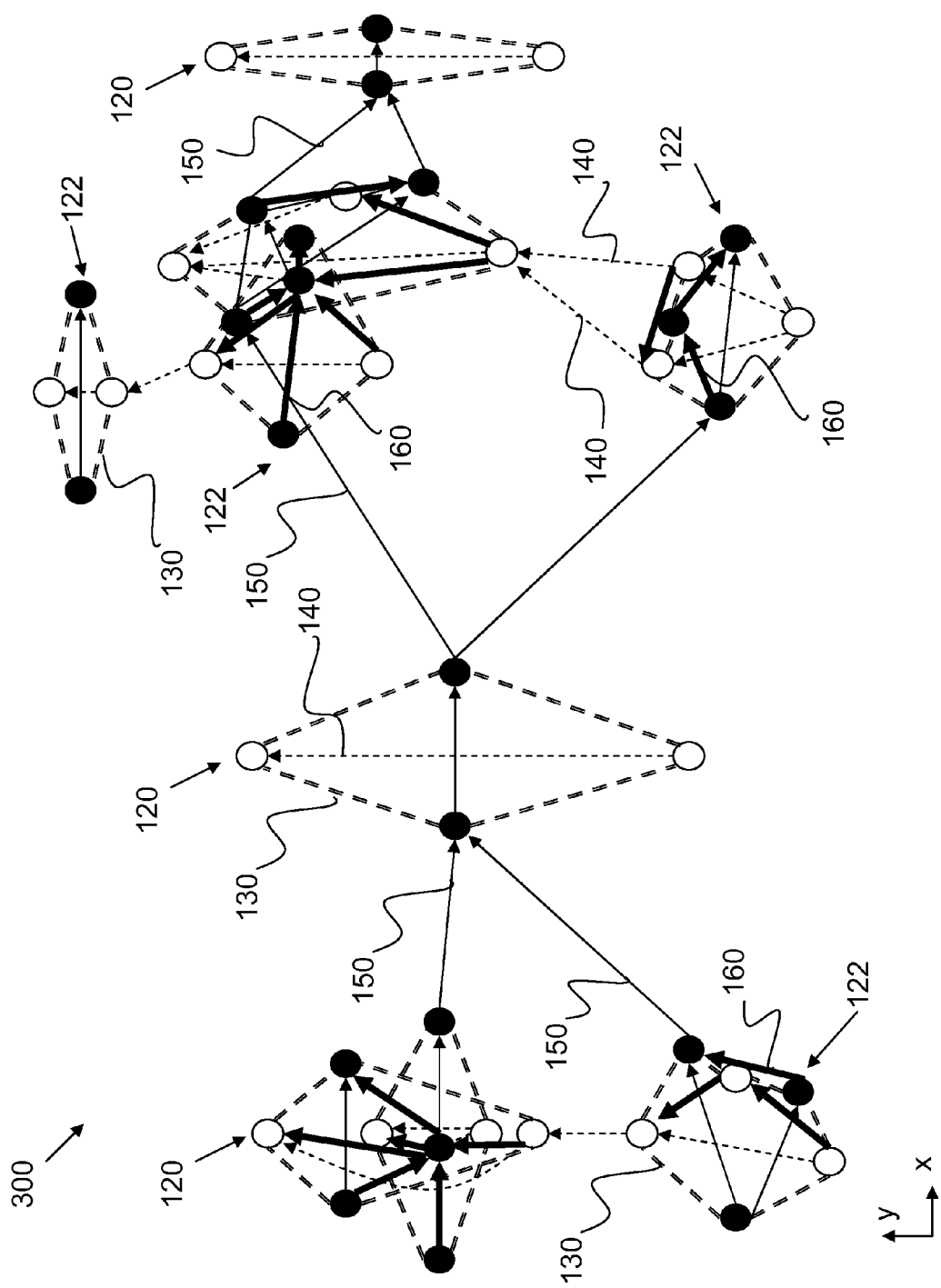

Returning to FIG. 3, using constraint graph 200 of FIG. 5, process P2 includes marking the two-dimensional constraints among the plurality of constraints to form a marked constraint graph 300. This marked constraint graph 300 shown in FIG. 6 is substantially similar to constraint graph 200 of FIG. 5, but with objects 112 omitted and 2-D constraints (arcs) 160 marked (2-D constraints denoted by bold lines with arrow heads). The two-dimensional (or simply, 2-D) constraints can be determined using, e.g., a well-known scanline algorithm.

Figure 7:
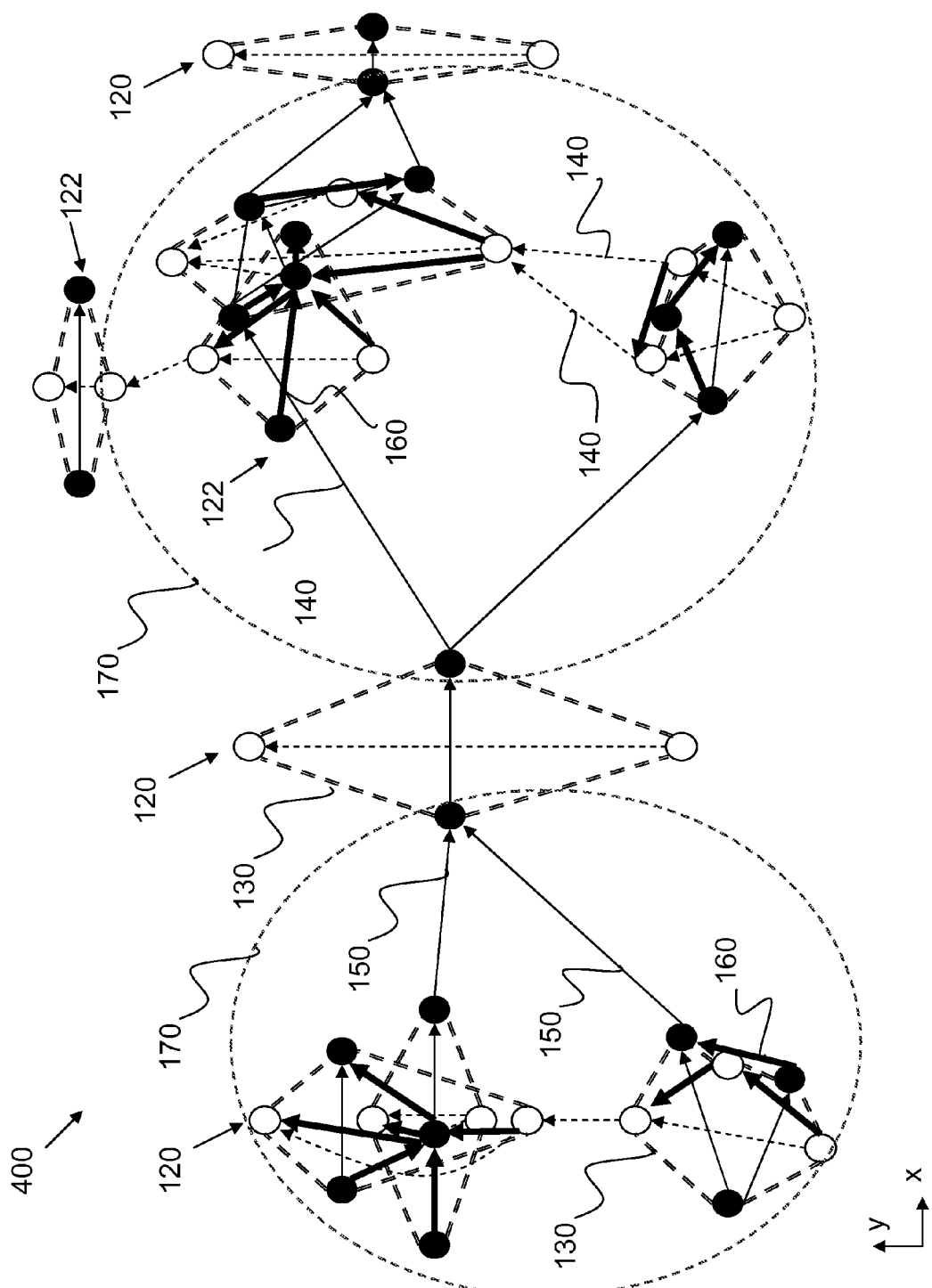

Returning to FIG. 3, process P3 may include generating two-dimensional clusters including groups of two-dimensional constraints. Examples of these clusters are illustrated in FIG. 7, which shows a constraint graph 400 having clusters 170 including groups of 2-D constraints (shown as arcs) 160. Process P3 may include using a clustering algorithm to determine which constraints fall into which clusters. In one embodiment, the generating of 2-D clusters may include setting a threshold distance between object nodes 120, 122, and grouping object nodes 120, 122 within the threshold distance into distinct clusters. For example, for a first node 120, 122 connecting with a 2-D constraint arc 160, additional nodes 120, 122 will be clustered with that first node 120, 122 in the case that the additional nodes 120, 122 are within a predetermined distance of the first node 120, 122. In this case, the distance may be measured as the shortest path length between the nodes 120, 122. Additionally, the generating of the 2-D clusters 170 may include assigning weights to different arcs (constraints), where 2-D arcs 160 are assigned a weight of zero (0), and other arcs (e.g., Y-constraint arcs 140) are assigned a weight of one (1) or some other non-zero quantity. By assigning different weights to 2-D arcs 160, this process ensures that the nodes connected to a 2-D arc will always be grouped into the same cluster.

Figure 8:
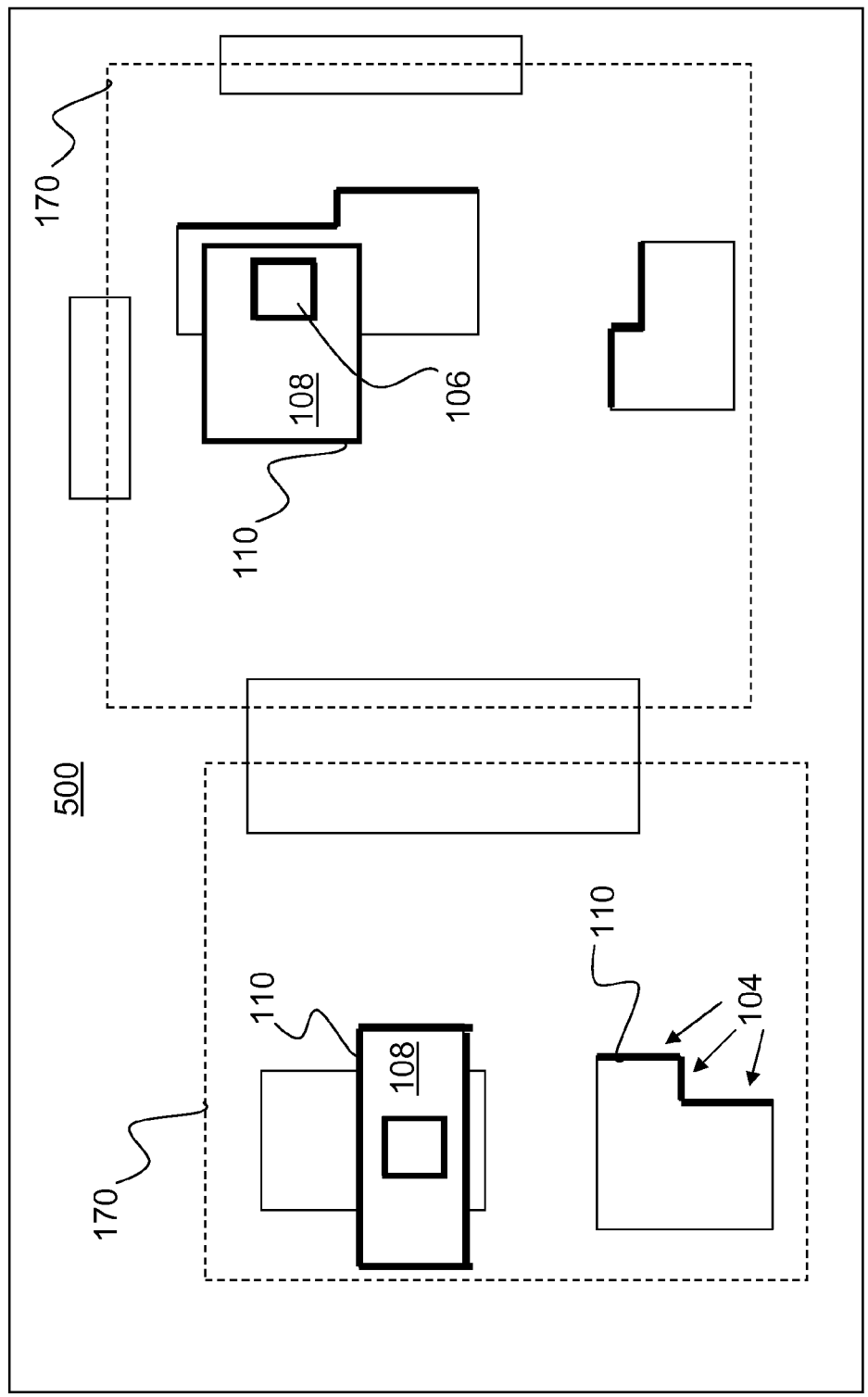

FIG. 8 shows a layout-view 500 of the clusters 170 shown and described with reference to FIG. 7 (and the objects such as vias 106 and metal layers 108 of FIG. 4). It is understood that those elements similarly numbered in FIGS. 4, 7 and 8 may be substantially similar elements.

Figure 9:
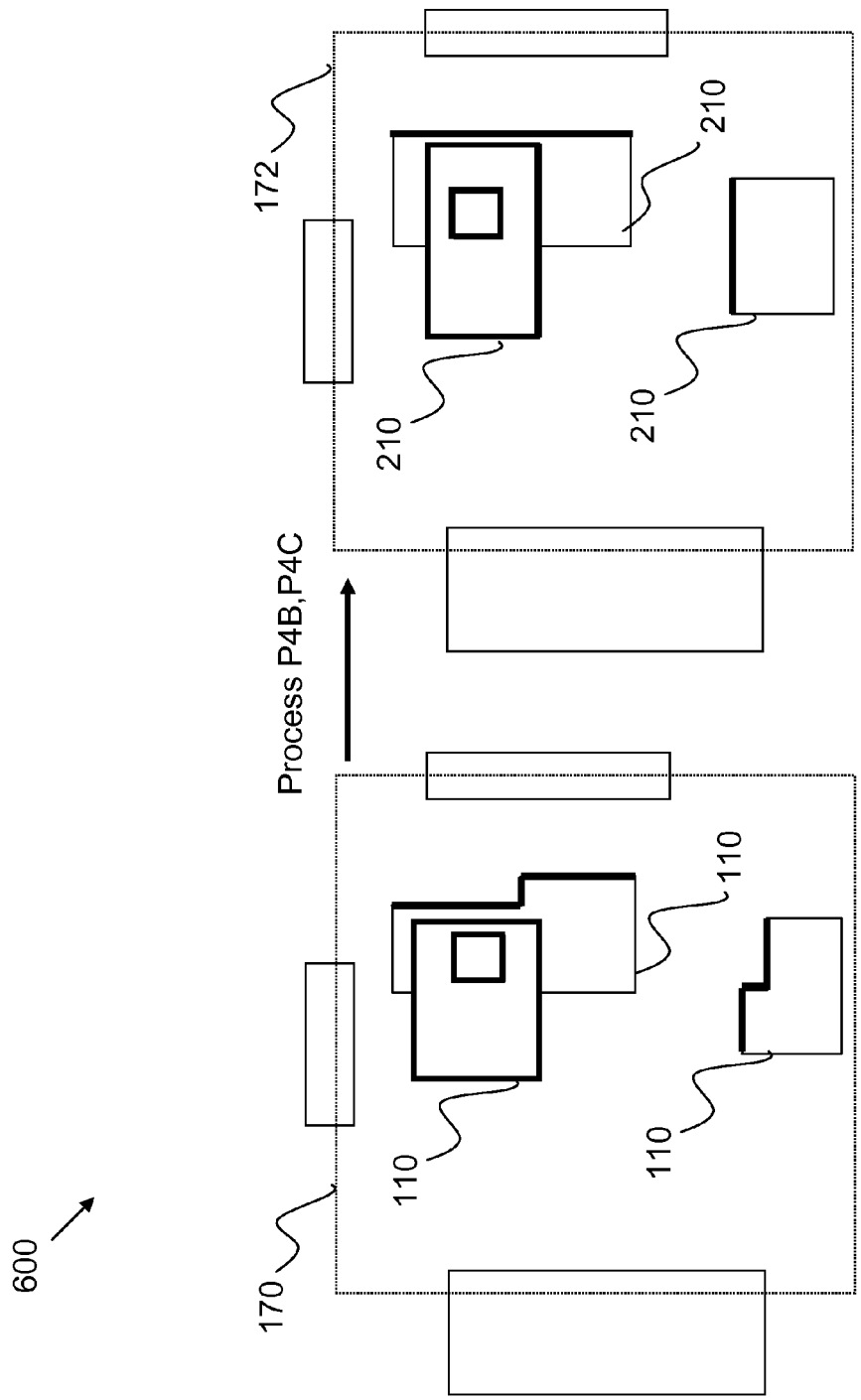

Returning to FIG. 3, decision D1 may include determining whether any 2-D clusters (e.g., 2-D clusters 170) have not yet been processed. As is described further herein, decision D1 may be repeated after each 2-D cluster is processed (described with reference to process P4). For the purpose of illustrating further teachings of the disclosure, it is assumed that at least one 2-D cluster (e.g., 2-D cluster 170) is yet to be processed, and that processing may be performed according to teachings described herein. In the case that decision D1 indicates a cluster is not yet processed, ("Yes" to decision D1), then the process P4 may include processing at least one of the 2-D clusters (e.g., 2-D cluster 170). Process P4 is shown as phantom box in FIG. 3 indicating that process P4 may include one or more of the sub-processes contained in the phantom box. For example, processing at least one 2-D cluster may include sub-process P4A, choosing an un-processed 2-D cluster. Using the 2-D clusters 170 of FIG. 8 as an example, assume the right-hand 2-D cluster 170 is un-processed. Turning to FIG. 9, a schematic process flow diagram 600 illustrating processing of the 2-D cluster 170 (using either process P4A or P4B) is shown. The un-processed 2-D cluster 170 (in layout form) from the right-hand portion of FIG. 8 is shown on the left-hand side of FIG. 9. Its corresponding 2-D cluster solution 172 (in layout form) is shown on the right-hand side of FIG. 9. As shown in FIG. 9, processes P4B or P4C may cause a transformation in the shapes and/or sizes (e.g., overall area) of one or more objects 110 into modified objects 210. Decision D2 may include determining whether movable objects (e.g., objects 112) in the 2-D cluster (e.g., 2-D cluster 170) have the same orientation. That is, as described with reference to FIG. 1, decision D2 includes determining whether all movable objects are similarly oriented (e.g., having orientations I, II, etc.). In the case that all the movable objects in the 2-D cluster have the same orientation, ("Yes" to decision D2), then the 2-D cluster may be processed using a graph-based approach (process P4B). Examples of graph-based approaches are described further herein with reference to FIGS. 13-17. In the case that all the movable objects in the 2-D cluster do not have the same orientation, then an integer linear programming (ILP)-based approach may be used to process the 2-D cluster (process P4C). Examples of ILP-based approaches are described further herein with reference to FIGS. 11-12.

With continuing reference to FIG. 3, after processing the 2-D clusters in process P4, the method may include returning to decision D1 to determine whether any 2-D clusters are un-processed. In the case that a 2-D cluster is un-processed, process P4 (including applicable sub-processes and decision) may be repeated. In the case that there exist no more 2-D clusters yet to be processed, then the global layout (e.g., layouts 100, 500) may be solved by entering the 2-D cluster solution into the global layout (in process P5). In the case that multiple 2-D clusters require processing, those multiple 2-D clusters can be processed using, for example, process P4 and its sub-processes, and then may be assembled to form a portion of the global layout (e.g., layouts 100, 500) to solve the global problem (process P5). The 2-D cluster solution may be entered into the global layout in any format acceptable to the global layout. For example, the 2-D cluster solution may take the form of the input layout/design rules 10 (e.g., data). This approach may allow for solving of "local" or "neighborhood" 2-D constraints, and integrating of those local solutions into a global solution.

Figure 10:
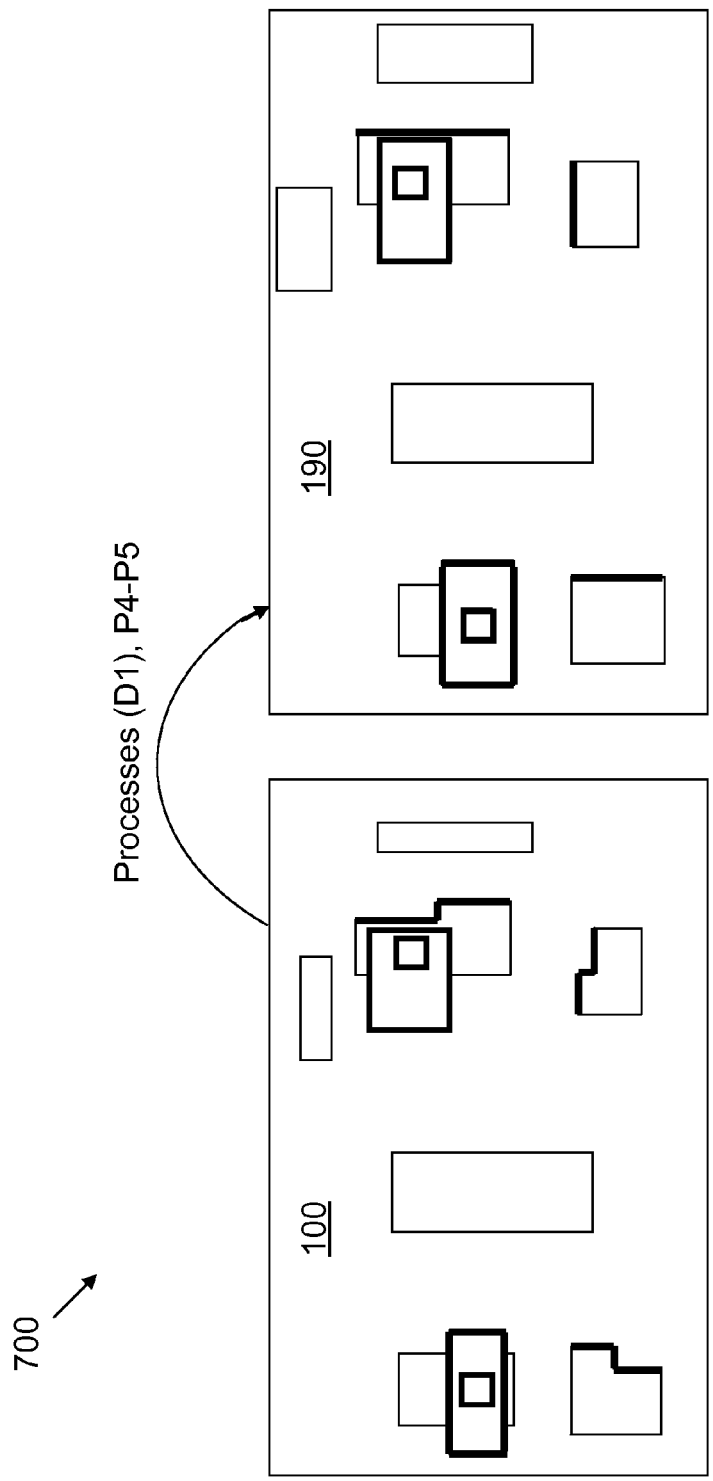

FIG. 10 shows schematic process flow diagram 700 demonstrating the overall processes P4-P5 (and including decision D1 where 2-D clusters are un-processed). An original layout 100 is shown transformed into a modified global layout 190. Modified global layout 190 may be a compilation of the solutions for "local" 2-D constraints, along with the one-dimensional constraints that may be solved according to methods known in the art. In one embodiment, the one-dimensional constraints are solved globally (e.g., taking into account the entire layout 100), while the 2-D constraints are solved locally (e.g., solutions are found within individual clusters 170, without taking into account the entire layout 100). These 2-D constraint solutions are then integrated into the global layout (e.g., layout 100), thereby transforming the layout into a modified global layout 190.

Figure 11:
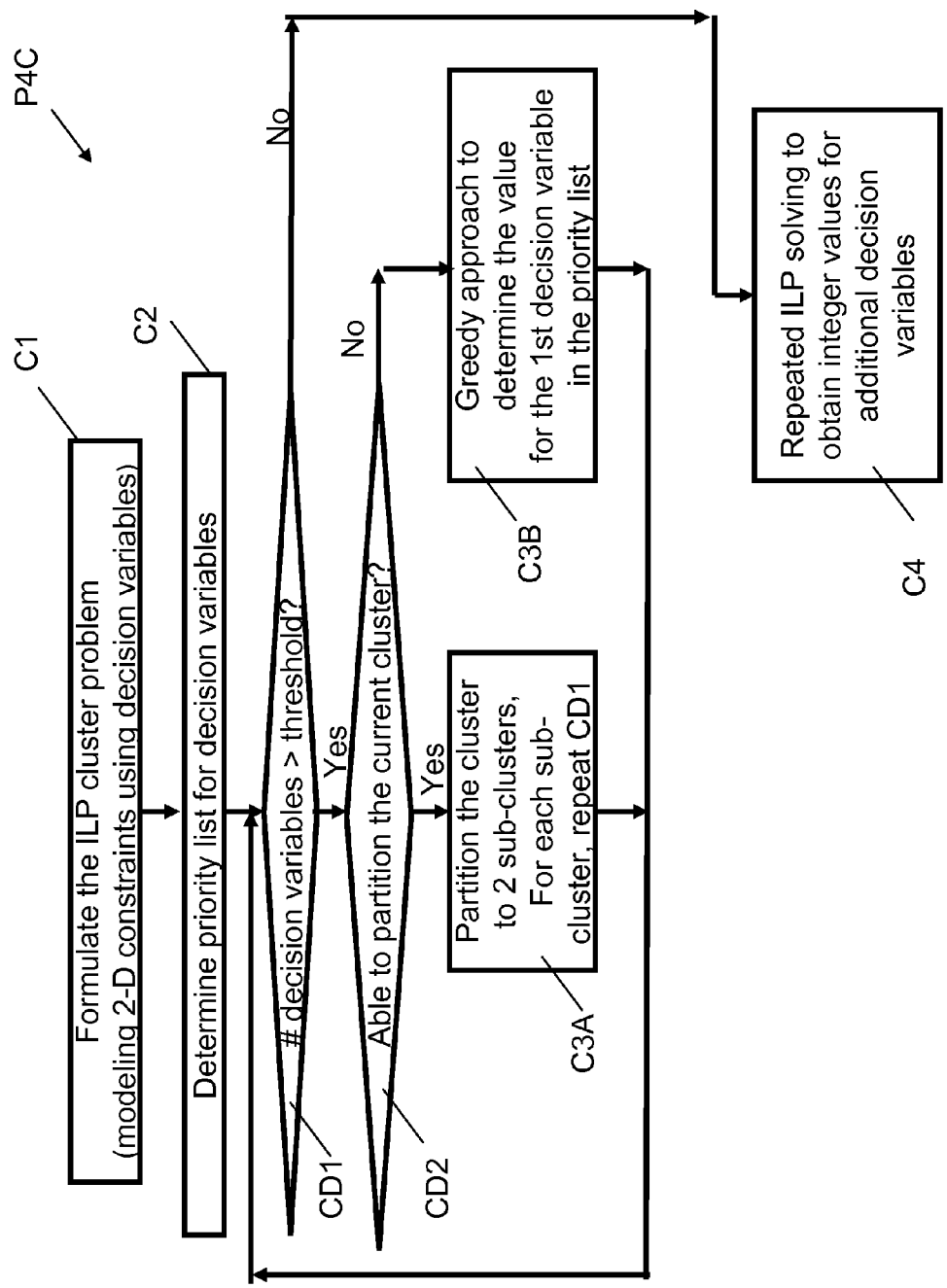
FIGS. 11-14 show process flow diagrams illustrating methods according to an embodiment.

Turning to FIG. 11, an example flow diagram illustrating processes in one integer linear programming (ILP)-based solving approach of process P4C (FIG. 3) is shown. A sub-process is shown as C1: formulating the ILP problem (e.g., modeling 2-D constraints using decision variables). This formulating may include assigning each constraint in the 2-D cluster to a distinct decision variable. For example, to fix a short edge violation, either the length of a short edge may be reduced to zero, or the length of the short edge may be increased to at least a threshold value. In this example, let variable $x_1$ and $x_2$ represent the two ends of the layout edge ($x_2 > x_1$, length=$x_2-x_1$), and assume the threshold value to be 100. Then a distinct decision variable b, which is an integer equal to the value of 0 or 1, is assigned to represent the two choices. Thus the 2-D constraint can be formulated as: $100b \leq x_2-x_1 \leq Cb$, where C is a constant number larger than 100. The 2-D constraints for other 2-D design rules can be similarly formulated. Sub-process C2 includes determining a priority list (prioritizing) of the distinct decision variables based upon a deviation of the 2-D constraint the decision variable represents from a predetermined threshold constraint value. In this case, decision variables may be given a higher priority if they represent 2-D constraints having small deviations from the predetermined threshold constraint value. That is, decision variables which have the highest chance of being solved are given a higher priority. Decision CD1 includes determining whether the number of decision variables in the ILP problem is larger than a predefined threshold. If the ILP is not larger than the predefined threshold ("No" to CD1), sub-process C4 includes using repeated ILP solving to obtain integer values for as many decision variables as possible.

If the ILP size is bigger than the predefined threshold ("Yes" to CD1), then decision CD2 determines whether the cluster (e.g., cluster 170 of FIGS. 7-8) can be partitioned. In the case that the cluster cannot be partitioned ("No" to CD2), a "greedy approach" (described further herein) may be used to determine a value for the first decision variable in the priority list. In the case that the cluster can be partitioned ("Yes" to CD2), sub-process C3A includes partitioning the cluster into sub-clusters until the sub-cluster (ILP cluster) is smaller than the predefined threshold ("No" to CD1).

In determining whether a cluster can be partitioned (CD2), the process may include determining whether a particular cluster has too many decision variables. This may indicate that the cluster is too "dense", having more 2-D constraints than desirable to handle the cluster and order the decision variables. In this case, the cluster may be partitioned. A first process in partitioning may include partitioning the cluster into two sub-clusters (C3A). Partitioning may be performed by reducing the threshold distance. For example, in FIG. 7, this may include setting a reduced threshold distance between object nodes 120, 122, and grouping object nodes 120, 122 within the reduced threshold distance into distinct clusters. This may create a greater number of smaller clusters of object nodes 120, 122. If these smaller clusters of object nodes 120, 122 are still larger than desirable to handle each cluster, then the process of partitioning may be repeated. Partitioning may be repeated until the threshold distance reaches a pre-determined value of the original threshold distance (e.g., 80 percent of the original threshold distance).

The "greedy" approach may include determining the integer value of the first decision variable in the priority list. Once that value is determined, it may be removed from the ILP cluster and decision CD1 may be made again for the cluster without the removed value. These sub-processes (C3A and/or C3B) may be repeated until the ILP size is less than the predefined threshold ("No" to CD1). At this point, repeated ILP solving (C4) is used to obtain integer values for as many decision variables as possible.

Figure 12:
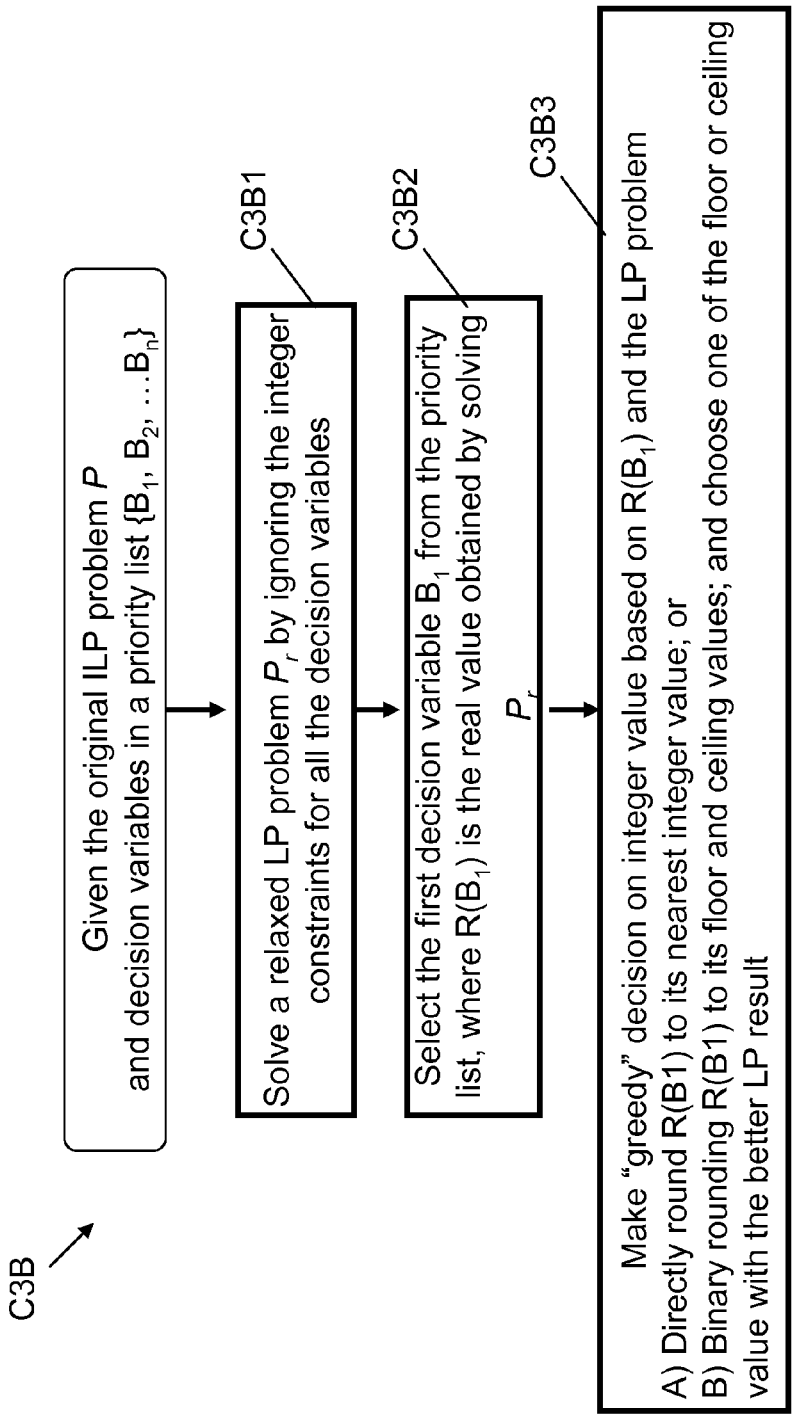

Turning to FIG. 12, a process flow diagram illustrating aspects of the "greedy" approach of sub-process C3B (FIG. 11) is shown. As indicated with reference to FIG. 11, a greedy approach may be used in the case that a cluster can not be partitioned (No to CD2). In one embodiment, the greedy approach may include process C3B1, taking the original ILP problem (e.g., a problem P) and decision variables in a priority list (e.g., B1, B2 . . . Bn) and solve a "relaxed" linear programming problem (Pr) by ignoring the integer constraints for all of the decision variables. Process C3B2 may include selecting the first decision variable (B1) from the priority list, where R(B1) is the real value of B1 obtained by solving the relaxed linear programming problem (P r). Process C3B3 may include making a "greedy" decision on the integer value based upon R(B1) and the linear programming problem (P r). This greedy decision may be made by either: directly rounding R(B1) to its nearest integer value; or using binary rounding of R(B1) to its floor and ceiling values, and choosing one of the floor or ceiling values with the preferable LP result.

Returning FIG. 11, as indicated herein, process C4 may include repeated ILP solving to obtain integer values for as many decision variables as possible. In one embodiment, this process may include: a) sorting decision variables in an array by priority; and b) performing a binary search to find the maximum set of feasible integer values for each decision variable using an ILP solver. The binary search may include: i) performing an ILP process with all integer constraints on the decision variables; ii-a) if a solution is found, then the process is finished; if a solution is not found, ii-b) ignore the second half of the integer constraints, and re-run the ILP solver with the first half of integer constraints; iii-a) if a feasible solution is found for the first half of integer constraints, repeat the procedure for the second half of the integer constraints while accounting for the fact that the first half of the integer constraints can already be satisfied; and iii-b) if a feasible solution is not found for the first half of the integer constraints, repeat the binary search process (steps (i)-(iii-b)).

Figure 13:
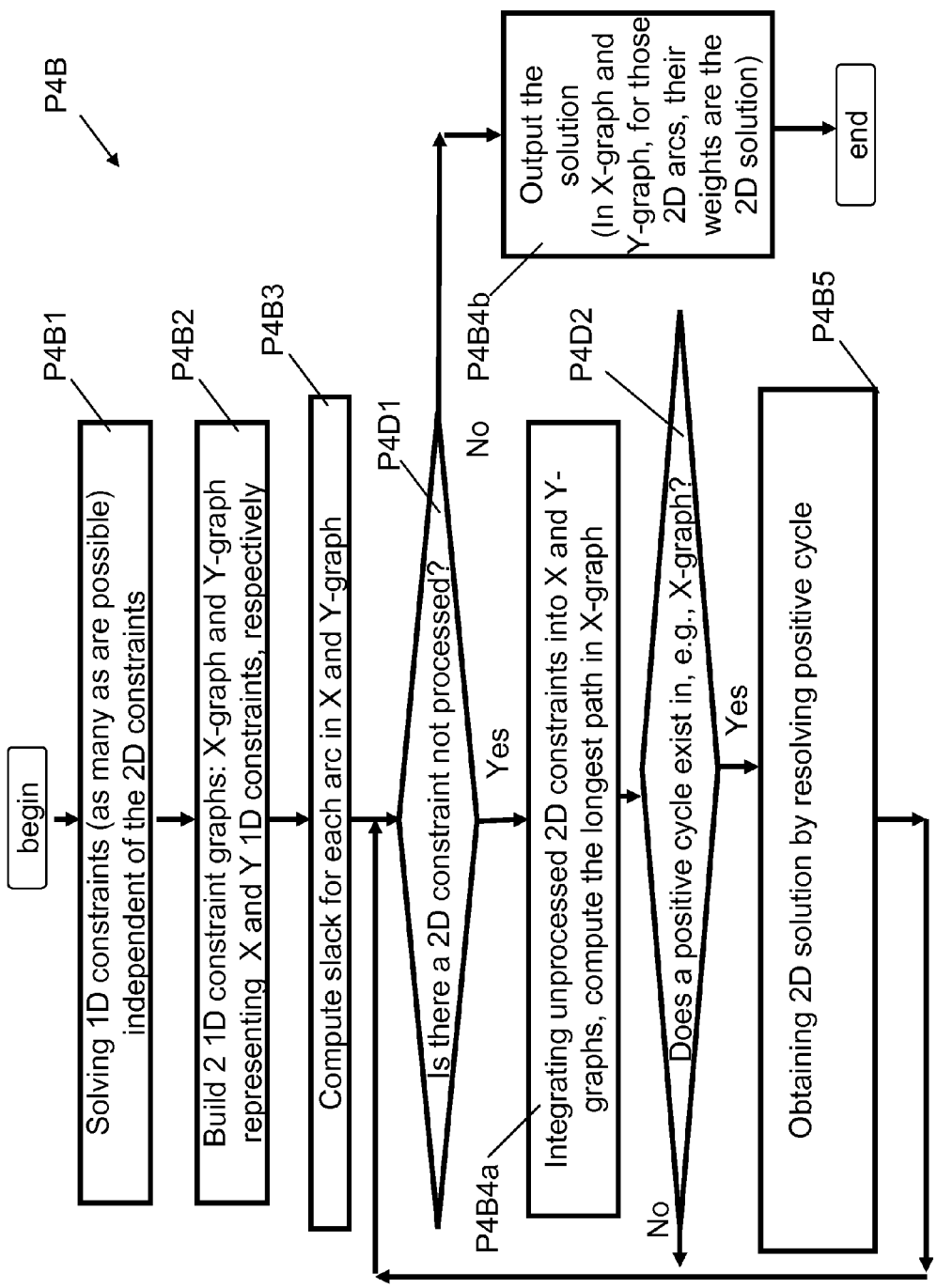

Turning to FIG. 13, a sub-process flow diagram of processes in the graph-based approach of P4B (FIG. 3) is shown. In one embodiment, the graph-based approach (P4B, FIG. 3) may include the following processes: P4B1, solving one-dimensional constraints (as many as possible) independent of the two-dimensional constraints in the graph representing the plurality of constraints; P4B2, constructing (building) a first one-dimensional graph representing a first one of the one-dimensional constraints (e.g., X) and constructing (building) a second one-dimensional graph representing a second one of the one-dimensional constraints (e.g., Y); P4B2, computing the slack for each arc in each of the one-dimensional constraint graphs; P4D1, determining whether one of the two-dimensional constraints has not been processed; P4B4a, in the case that one of the two-dimensional constraints is unprocessed, integrating the unprocessed two-dimensional constraint into the first one-dimensional graph and the second one-dimensional graph; and P4B4b, in the case that there exist no 2D constraints that are unprocessed, outputting the solution (e.g., for 2-D arcs, their weights are the solutions). After the integrating of P4B4a, in P4D2, determining whether a positive cycle exists in the one-dimensional graph (e.g., x-graph); and P4B5, obtaining the 2D solution by resolving the positive cycle (including, modifying the two one-dimensional graphs). As used herein, the term "positive cycle" refers to the cycle in a graph such that the summation of all weights of the arcs in the cycle is greater than zero. The existence of positive cycles means that there exist conflicts among the constraints in the graph and that there is no feasible solution. In this case, some constraints need to be either removed or relaxed in order to obtain a solution.

Figure 14:
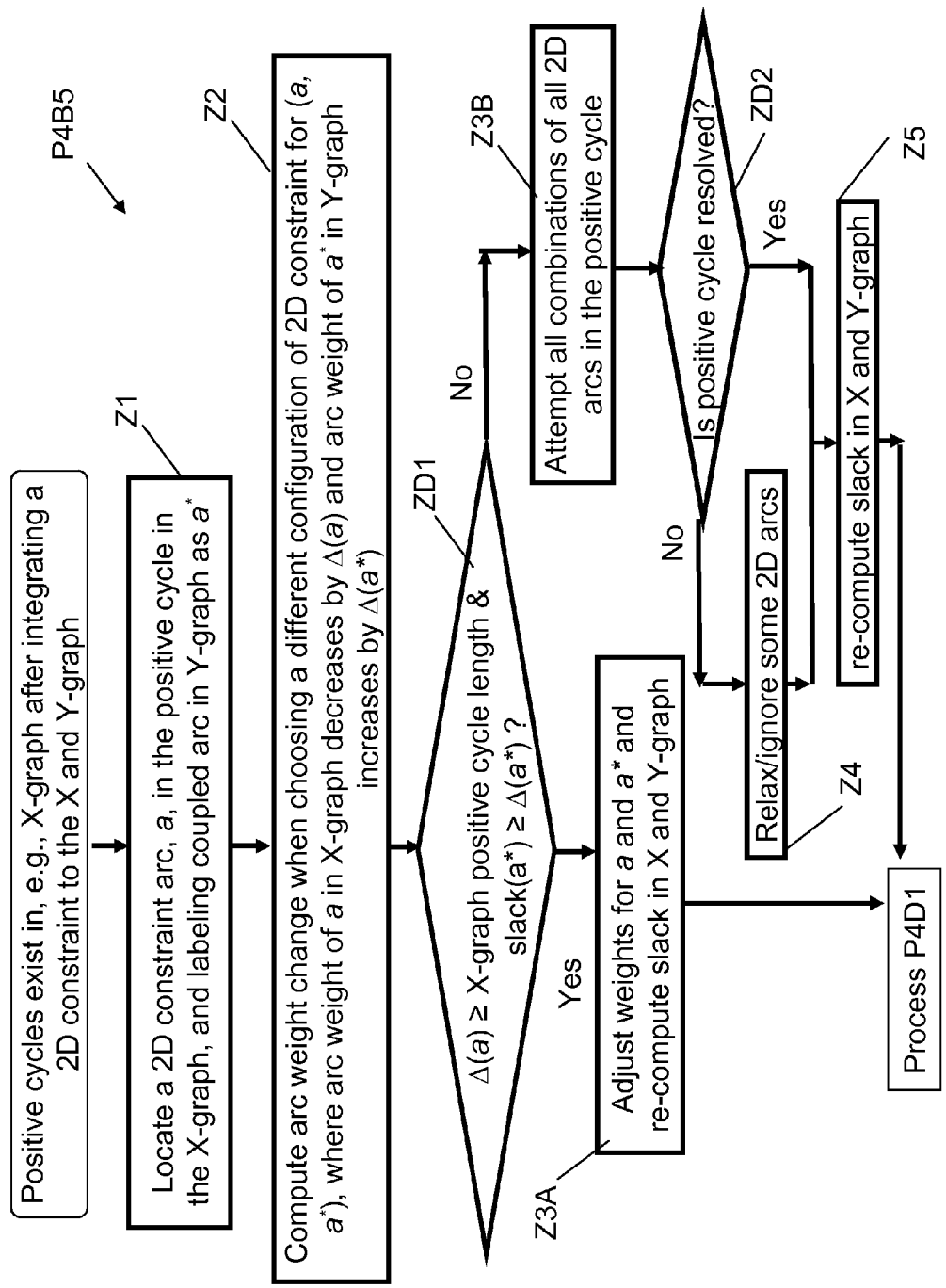

Turning to FIG. 14, a flow diagram illustrating steps in the process P4B5 of FIG. 13 is shown. This solving process is based upon the fact that positive cycles still exist in the one dimensional graph (e.g., x-graph) after integrating a 2-D constraint into both one-dimensional graphs (e.g., x-graph and y-graph). The solving may include the following process: Z1, locating a 2D constraint arc (a) in the positive cycle in the one-dimensional graph (e.g., x-graph) and labeling its coupled arc in the other one-dimensional graph (e.g., y-graph) as (a*); Z2, computing an arc weight change (delta-arc weight) when choosing a different configuration of the 2D constraint for (a, a*), where the arc weight of (a) in the x-graph decreases by delta(a) and the arc weight of (a*) in the y-graph increases by delta(a*); decision ZD1, determining whether the delta(a) is greater than or equal to the x-graph positive cycle length and the slack(a*) is greater than or equal to the delta(a*); if yes to ZD1, then process Z3A includes adjusting weights for (a) and (a*), and re-computing the slack in the x-graph and y-graph; if no to ZD1, then process Z3B includes attempting all combinations of all 2D arcs in the positive cycle; following process Z3B, decision ZD2 includes determining whether the positive cycle is resolved; if yes to ZD2, then in Z5 the slack for the x-graph and y-graph are re-computed; if no to ZD2, then in Z4, some 2D arcs are ignored or relaxed, and the slack for the x-graph and y-graph are recomputed in Z5.

Figure 15:
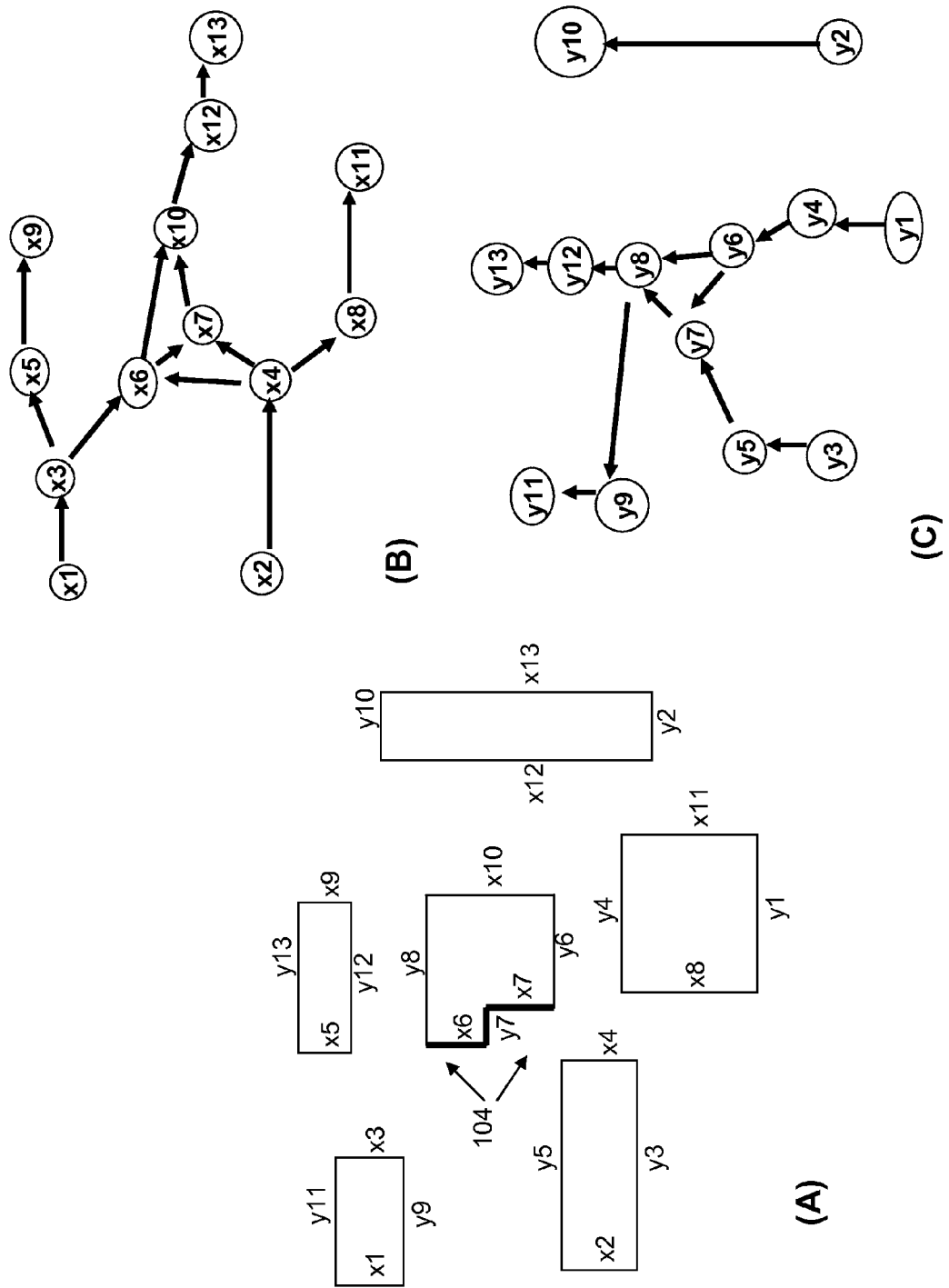
FIGS. 15A-15C show illustrative schematic diagrams of portions of an integrated circuit layout.
Figure 16:
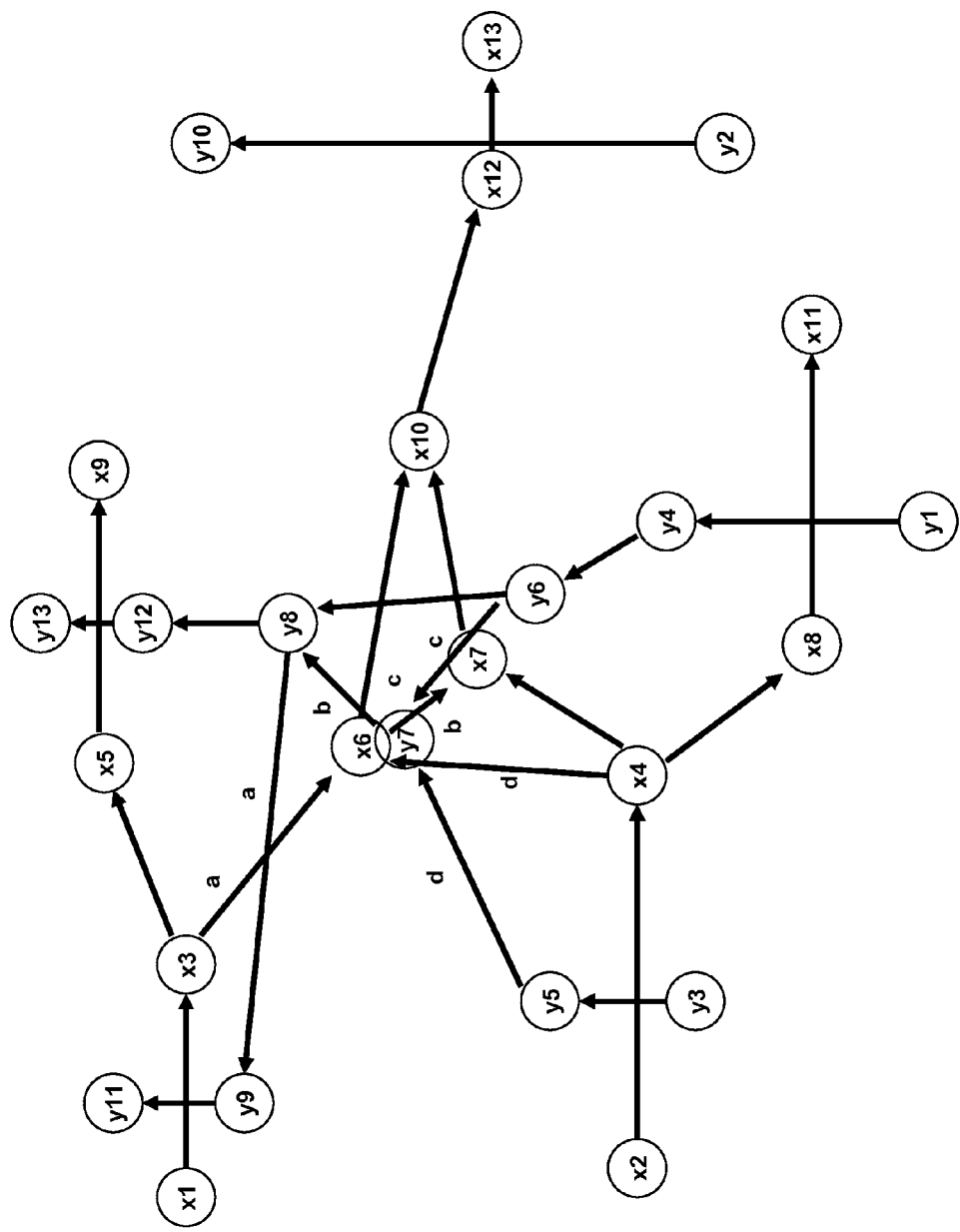
FIGS. 16-17 show illustrative schematic diagrams of portions of an integrated circuit layout.
Figure 17:
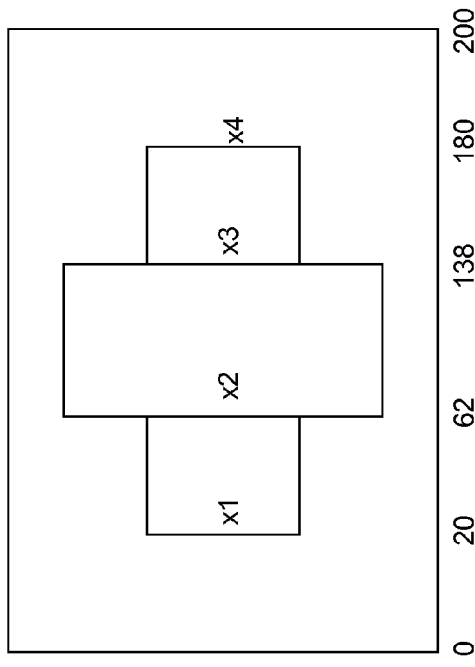
Figure 17:
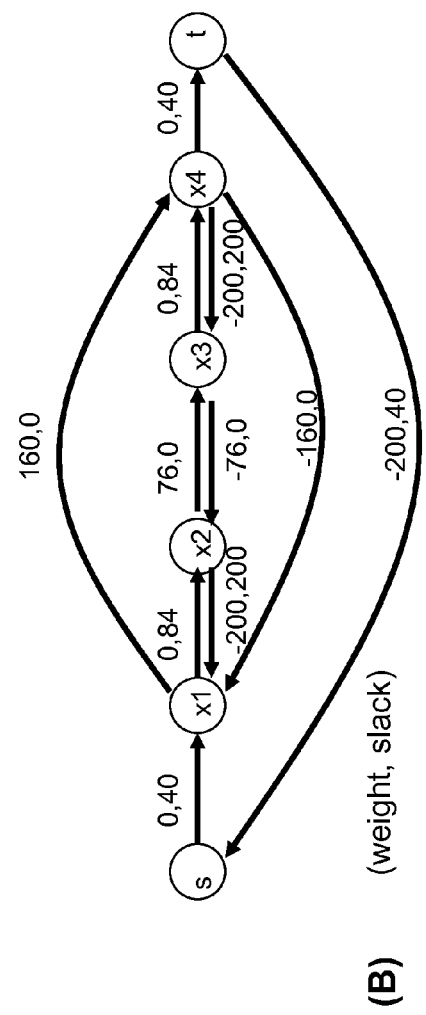

An example of a constraint graph is shown in FIGS. 15-16. Specifically, FIG. 15A shows a layout view of a constraint graph. FIGS. 15B and 15C show two one-dimensional constraint graphs (node views) plotted from the layout of FIG. 15A. FIG. 15B shows a constraint graph (node view) of x-axis constraints, and FIG. 15C shows a constraint graph (node view) of y-axis constraints. FIG. 16 shows integrating of the one-dimensional constraints (e.g., x-axis constraints) into the graph of the other one-dimensional constraints (e.g., y-axis constraints). This integration allows for coupling of one-dimensional arcs into 2-D constraints. For example, FIG. 16 shows 2-D constraints (coupled one-dimensional arcs): a: (x3,x6), (y8,y9); b: (x6,x7), (y7,y8); c: (x6,x7), (y6,y7); and d: (x4,x6), (y5,y7). It is understood that the graphs shown and described with reference to FIGS. 15-16 are merely shown for illustrative purposes.

FIGS. 17A and 17B show layout view (17A) and node view (17B) of example slack graphs for non-directed acyclic graphs (DAG). As is known in the art, non-directed acyclic graphs (non-DAG) are those directed graphs with directed cycles (directed cycle means there exists a path that starts at some vertex v and eventually loops back to v again when following a sequence of edges in the graph). As shown in process P4B5 of FIG. 13, obtaining of a 2D solution on a graph with positive cycles may be performed by resolving the positive cycle of the one-dimensional graphs (e.g., X-graph). However, in cases where the graph is a non-DAG graph, computing of the slack may include the following processes:

S1A, given the constraint graph G, inputting the weight for each arc, adding two nodes, (s) and (t), to represent the leftmost boundary at location loc(s) and the rightmost boundary at location loc(t) in the layout respectively, adding arcs from node s to any other nodes excluding node t with a weight of zero, adding arcs from any other nodes excluding node s to node t with a weight of zero, and adding the arc from node t to node s with a weight of loc(s)-loc(t), to get a graph, G=(V,E);

S1, compact the layout to node (s) (using a leftward compaction), for each node (v), to get the leftmost location as lb(v);

S2, compact the layout to node (t) (rightward compaction), for each node (v), to get the rightmost location as ub(v);

S3, for each node (n):

S3.1, assign Value(v)=lb(v), for v ∈V, v≠n; assign Value(n) =ub(n);

S3.2, for each outgoing arc (n, v) from n, update Value(v) =max(Value(v), Value(n)+weight(n,v)), continuing to update value (v) for the remainder of nodes until there is no value change (because there is no positive cycle in G, this updating will stop); and S3.3, for each incoming arc to n, $a_i=(n_i, n)$, $Slack(a_i)=$Value (n)−Value($n_i$)−Weight($a_i$).

FIG. 17(B) shows the result of slack computation for the non-DAG constraint graph of the layout shown in FIG. 17(A), where the weight and the computed slack value are denoted as a pair of integers associated with each arc. It is understood that these slack graphs shown and described with reference to FIGS. 17(A)-17(B) are merely shown for illustrative purposes.

Figure 18:
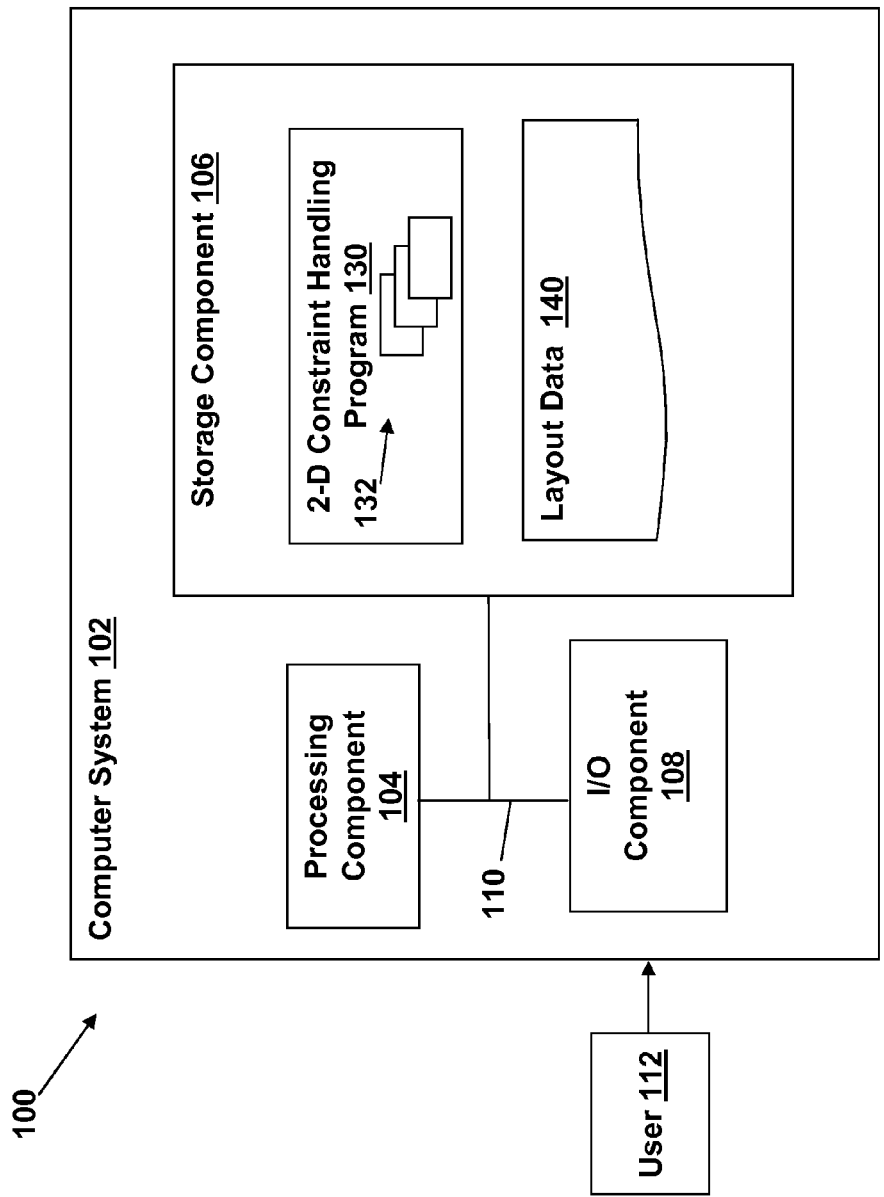
FIG. 18 shows an illustrative environment according to an embodiment.

FIG. 18 depicts an illustrative environment 100 for handling two-dimensional (2-D) constraints in layout optimization for an integrated circuit layout according to an embodiment. To this extent, the environment 100 includes a computer system 102 that can perform a process described herein in order to handle 2-D constraints in an integrated circuit layout. In particular, the computer system 102 is shown as including a 2-D constraint handling program 130, which makes computer system 102 operable to handle 2-D constraints in layout optimization for an integrated circuit layout by performing any/all of the processes described herein and implementing any/all of the embodiments described herein.

The computer system 102 is shown including a processing component 104 (e.g., one or more processors), a storage component 106 (e.g., a storage hierarchy), an input/output (I/O) component 108 (e.g., one or more I/O interfaces and/or devices), and a communications pathway 110. In general, the processing component 104 executes program code, such as the 2-D constraint handling program 130, which is at least partially fixed in the storage component 106. While executing program code, the processing component 104 can process data, which can result in reading and/or writing transformed data from/to the storage component 106 and/or the I/O component 108 for further processing. The pathway 110 provides a communications link between each of the components in the computer system 102. The I/O component 108 can comprise one or more human I/O devices, which enable a human user 112 to interact with the computer system 102 and/or one or more communications devices to enable a system user 112 to communicate with the computer system 102 using any type of communications link. To this extent, the 2-D constraint handling program 130 can manage a set of interfaces (e.g., graphical user interface(s), application program interface, etc.) that enable human and/or system users 112 to interact with the timing quantity ordering program 130. Further, the 2-D constraint handling program 130 can manage (e.g., store, retrieve, create, manipulate, organize, present, etc.) data, such as timing quantities 140, etc., using any solution.

In any event, the computer system 102 can comprise one or more general purpose computing articles of manufacture (e.g., computing devices) capable of executing program code, such as the 2-D constraint handling program 130, installed thereon. As used herein, it is understood that "program code" means any collection of instructions, in any language, code or notation, that cause a computing device having an information processing capability to perform a particular function either directly or after any combination of the following: (a) conversion to another language, code or notation; (b) reproduction in a different material form; and/or (c) decompression. To this extent, the 2-D constraint handling program 130 can be embodied as any combination of system software and/or application software.

Further, the 2-D constraint handling program 130 can be implemented using a set of modules 132. In this case, a module 132 can enable the computer system 102 to perform a set of tasks used by the 2-D constraint handling program 130, and can be separately developed and/or implemented apart from other portions of the 2-D constraint handling program 130. As used herein, the term "component" means any configuration of hardware, with or without software, which implements the functionality described in conjunction therewith using any solution, while the term "module" means program code that enables the computer system 102 to implement the functionality described in conjunction therewith using any solution. When fixed in a storage component 106 of a computer system 102 that includes a processing component 104, a module is a substantial portion of a component that implements the functionality. Regardless, it is understood that two or more components, modules, and/or systems may share some/all of their respective hardware and/or software. Further, it is understood that some of the functionality discussed herein may not be implemented or additional functionality may be included as part of the computer system 102.

When the computer system 102 comprises multiple computing devices, each computing device may have only a portion of 2-D constraint handling program 130 fixed thereon (e.g., one or more modules 132). However, it is understood that the computer system 102 and 2-D constraint handling program 130 are only representative of various possible equivalent computer systems that may perform a process described herein. To this extent, in other embodiments, the functionality provided by the computer system 102 and 2-D constraint handling program 130 can be at least partially implemented by one or more computing devices that include any combination of general and/or specific purpose hardware with or without program code. In each embodiment, the hardware and program code, if included, can be created using standard engineering and programming techniques, respectively.

Regardless, when the computer system 102 includes multiple computing devices, the computing devices can communicate over any type of communications link. Further, while performing a process described herein, the computer system 102 can communicate with one or more other computer systems using any type of communications link. In either case, the communications link can comprise any combination of various types of wired and/or wireless links; comprise any combination of one or more types of networks; and/or utilize any combination of various types of transmission techniques and protocols.

The computer system 102 can obtain or provide data, such as layout data 140 using any solution. For example, the computer system 102 can generate and/or be used to generate layout data 140, retrieve layout data 140, from one or more data stores, receive layout data 140, from another system, send layout data 140 to another system, etc.

While shown and described herein as a method and system for handling of two-dimensional (2-D) constraints in an integrated circuit layout, it is understood that aspects of the invention further provide various alternative embodiments. For example, in one embodiment, the invention provides a computer program fixed in at least one computer-readable medium, which when executed, enables a computer system to handle two-dimensional (2-D) constraints in layout optimization for an integrated circuit layout. To this extent, the computer-readable medium includes program code, such as the 2-D constraint handling program 130 (FIG. 18), which implements some or all of the processes and/or embodiments described herein. It is understood that the term "computer-readable medium" comprises one or more of any type of tangible medium of expression, now known or later developed, from which a copy of the program code can be perceived, reproduced, or otherwise communicated by a computing device. For example, the computer-readable medium can comprise: one or more portable storage articles of manufacture; one or more memory/storage components of a computing device; paper; etc.

In another embodiment, the invention provides a method of providing a copy of program code, such as the 2-D constraint handling program 130 (FIG. 18), which implements some or all of a process described herein. In this case, a computer system can process a copy of program code that implements some or all of a process described herein to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a system for handling 2-D constraints in layout optimization for an integrated circuit layout. In this case, a computer system, such as the computer system 102 (FIG. 18), can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; etc.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A computer-implemented method for handling a plurality of constraints in an integrated circuit layout using at least one computing device, the method comprising:
    building a graph representing the plurality of constraints;
    marking two-dimensional constraints in the plurality of constraints on the graph to form a marked constraint graph;
    generating two-dimensional clusters including groups of the two-dimensional constraints, using the at least one computing device;
    handling at least one of the two-dimensional clusters, the handling including finding a solution for the two-dimensional constraints in the at least one two-dimensional cluster, using the at least one computing device;
    repeating the handling for any unprocessed two-dimensional clusters until all of the two-dimensional clusters are handled; and
    adopting the solution for each of the two-dimensional clusters to solve at least a portion of the plurality of constraints including the two-dimensional clusters.

2. The computer implemented method of claim 1, wherein the handling further includes:
    determining whether all movable objects in the at least one two-dimensional cluster have a same orientation;
    in the case that all of the movable objects in the at least one two-dimensional cluster have the same orientation, using a graph-based approach to solve the two-dimensional constraints in the at least one two-dimensional cluster; and
    in the case that all of the movable objects in the at least one two-dimensional cluster do not have the same orientation, using an integer linear programming approach to solve the two-dimensional constraints in the at least one two-dimensional cluster.

3. The computer-implemented method of claim 2, wherein the graph-based approach includes:
    solving one-dimensional constraints independent of the two-dimensional constraints in the graph representing the plurality of constraints;
    constructing a first one-dimensional graph representing a first one of the one-dimensional constraints;
    constructing a second one-dimensional graph representing a second one of the one-dimensional constraints;
    computing a slack for each arc in the first one-dimensional graph and the second one-dimensional graph;
    determining whether one of the two-dimensional constraints has not been processed;
    in the case that one of the two-dimensional constraints has not been processed, integrating the un-processed two-dimensional constraint into the first one-dimensional graph and the second one-dimensional graph;
    solving the two-dimensional constraint by modifying the two one-dimensional graphs; and
    repeating the determining, integrating and solving of the two-dimensional constraints for additional unprocessed two-dimensional constraints until all two-dimensional constraints are processed.

4. The computer-implemented method of claim 3, wherein the computing of the slack of each arc includes computing the slack of an arc in a non-directed acyclic graph.

5. The computer-implemented method of claim 3, wherein the solving of the two-dimensional constraint includes:
    computing a longest path in each of the first one-dimensional graph and the second one-dimensional graph;
    determining whether one of first one-dimensional graph or the second one-dimensional graph has a positive cycle; and
    in the case that a positive cycle exists, modifying the two one-dimensional graphs to resolve the positive cycle, the modifying including: applying a different configuration of the two-dimensional constraint, removing the two-dimensional constraint, or relaxing the two dimensional constraint.

6. The computer-implemented method of claim 2, wherein the integer linear programming approach includes assigning a distinct decision variable to each two-dimensional constraint in the two-dimensional cluster.

7. The computer-implemented method of claim 6, wherein the integer linear programming approach further includes prioritizing each distinct decision variable based upon a deviation of the constraint from a predetermined threshold constraint value.

8. The computer-implemented method of claim 2, wherein the generating of the two-dimensional clusters includes:
    setting a threshold distance between object nodes; and
    grouping object nodes within the threshold distance into distinct clusters.

9. A computer system comprising:
    at least one computing device configured to handle a plurality of constraints in an integrated circuit (IC) layout by performing actions comprising:
        building a graph representing the plurality of constraints;
        marking two-dimensional constraints in the plurality of constraints on the graph to form a marked constraint graph;
        generating two-dimensional clusters including groups of the two-dimensional constraints;
        handling at least one of the two-dimensional clusters, the handling including finding a solution for the two-dimensional constraints in the at least one two-dimensional cluster;
        repeating the handling for any unprocessed two-dimensional clusters until all of the two-dimensional clusters are handled; and
        adopting the solution for each of the two-dimensional clusters to solve at least a portion of the plurality of constraints including the two-dimensional clusters.

10. The system of claim 9, wherein the handling further includes:
    determining whether all movable objects in the at least one two-dimensional cluster have a same orientation;
    in the case that all of the movable objects in the at least one two-dimensional cluster have the same orientation, using a graph-based approach to solve the two-dimensional constraints in the at least one two-dimensional cluster; and
    in the case that all of the movable objects in the at least one two-dimensional cluster do not have the same orientation, using an integer linear programming approach to solve the two-dimensional constraints in the at least one two-dimensional cluster.

11. The system of claim 10, wherein the graph-based approach includes:
solving one-dimensional constraints independent of the two-dimensional constraints in the graph representing the plurality of constraints;
constructing a first one-dimensional graph representing a first one of the one-dimensional constraints;
constructing a second one-dimensional graph representing a second one of the one-dimensional constraints;
computing a slack for each arc in the first one-dimensional graph and the second one-dimensional graph;
determining whether one of the two-dimensional constraints has not been processed;
in the case that one of the two-dimensional constraints has not been processed, integrating the un-processed two-dimensional constraint into the first one-dimensional graph and the second one-dimensional graph;
solving the two-dimensional constraint by modifying the two one-dimensional graphs; and
repeating the determining, integrating and solving of the two-dimensional constraints for additional unprocessed two-dimensional constraints until all two-dimensional constraints are processed.

12. The system of claim 11, wherein the computing of the slack of each arc includes computing the slack of an arc in a non-directed acyclic graph.

13. The system of claim 10, wherein the integer linear programming approach includes assigning a distinct decision variable to each two-dimensional constraint in the at least one two-dimensional cluster.

14. The system of claim 13, wherein the integer linear programming approach further includes prioritizing each distinct decision variable based upon a deviation of the constraint from a predetermined threshold constraint value.

15. The system of claim 10, wherein the generating of the two-dimensional clusters includes:
setting a threshold distance between object nodes; and
grouping object nodes within the threshold distance into distinct clusters.

16. A computer program comprising program code embodied in at least one non-transitory computer-readable medium, which when executed, enables a computer system to implement a method for handling a plurality of constraints in an integrated circuit (IC) layout, the method comprising:
building a graph representing the plurality of constraints;
marking two-dimensional constraints in the plurality of constraints on the graph to form a marked constraint graph;
generating two-dimensional clusters including groups of the two-dimensional constraints;
handling at least one of the two-dimensional clusters, the handling including finding a solution for the two-dimensional constraints in the at least one two-dimensional cluster;
repeating the handling for any unprocessed two-dimensional clusters until all of the two-dimensional clusters are handled; and
adopting the solution for each of the two-dimensional clusters to solve at least a portion of the plurality of constraints including the two-dimensional clusters.

17. The computer program of claim 16, wherein the handling further includes:
determining whether all movable objects in the at least one two-dimensional cluster have a same orientation;
in the case that all of the movable objects in the at least one two-dimensional cluster have the same orientation, using a graph-based approach to solve the two-dimensional constraints in the at least one two-dimensional cluster;
in the case that all of the movable objects in the at least one two-dimensional cluster do not have the same orientation, using an integer linear programming approach to solve the two-dimensional constraints in the at least one two-dimensional cluster.

18. The computer program of claim 17, wherein the graph-based approach includes:
solving one-dimensional constraints independent of the two-dimensional constraints in the graph representing the plurality of constraints;
constructing a first one-dimensional graph representing a first one of the one-dimensional constraints;
constructing a second one-dimensional graph representing a second one of the one-dimensional constraints;
computing a slack for each arc in the first one-dimensional graph and the second one-dimensional graph;
determining whether one of the two-dimensional constraints has not been processed;
in the case that one of the two-dimensional constraints has not been processed, integrating the un-processed two-dimensional constraint into the first one-dimensional graph and the second one-dimensional graph;
solving the two-dimensional constraint by modifying the two one-dimensional graphs; and
repeating the determining, integrating and solving of the two-dimensional constraints for additional unprocessed two-dimensional constraints until all two-dimensional constraints are processed.

19. The computer program of claim 18, wherein the computing of the slack of each arc includes computing the slack of an arc in a non-directed acyclic graph.

20. The computer program of claim 17, wherein the integer linear programming approach includes:
assigning a distinct decision variable to each two-dimensional constraint in the two-dimensional cluster; and
prioritizing each distinct decision variable based upon a deviation of the constraint from a predetermined threshold constraint value.

* * * * *